United States Patent
Azumano et al.

(10) Patent No.: US 8,434,993 B2
(45) Date of Patent: May 7, 2013

(54) ROBOT APPARATUS AND PROCESSING APPARATUS PROVIDED THEREWITH, ASHING SYSTEM, AND ASHING METHOD

(75) Inventors: Hidehito Azumano, Kanagawa-ken (JP); Masahiro Tanabe, Kanagawa-ken (JP)

(73) Assignee: Shibaura-Mechatronics Corporation, Yokohama-Shi (JP)

( * ) Notice: Subject to any disclaimer, the term of this patent is extended or adjusted under 35 U.S.C. 154(b) by 674 days.

(21) Appl. No.: 12/516,819

(22) PCT Filed: Nov. 30, 2007

(86) PCT No.: PCT/JP2007/073182
§ 371 (c)(1),
(2), (4) Date: Oct. 13, 2009

(87) PCT Pub. No.: WO2008/069130
PCT Pub. Date: Jun. 12, 2008

(65) Prior Publication Data
US 2010/0048035 A1 Feb. 25, 2010

(30) Foreign Application Priority Data
Dec. 5, 2006 (JP) ................. 2006-328872

(51) Int. Cl.
*H01L 21/677* (2006.01)
(52) U.S. Cl.
USPC ............ 414/805; 414/217; 414/806; 414/935
(58) Field of Classification Search ................... 414/217, 414/805, 806, 935
See application file for complete search history.

(56) References Cited

FOREIGN PATENT DOCUMENTS

| JP | 11-135600 A | 5/1999 |
|---|---|---|
| JP | 11-163075 A | 6/1999 |
| JP | 2000-174091 A | 6/2000 |
| JP | 2003-059998 A | 2/2003 |
| JP | 2003-060008 A | 2/2003 |

OTHER PUBLICATIONS

International Search Report for PCT/JP2007/073182 dated Dec. 25, 2007.
Korean Office action for 10-2009-7013900 dated May 16, 2011.
Chinese Office Action for Application No. 200780044654.2, dated Apr. 14, 2010.
Japanese Office action for 2008-548261 dated Aug. 23, 2011.

*Primary Examiner* — Scott Lowe
(74) *Attorney, Agent, or Firm* — Pearne & Gordon LLP

(57) ABSTRACT

A robot apparatus according to the invention is configured to hand over a workpiece by rotating by a prescribed angle a finger including a holding means for holding the workpiece. The robot apparatus includes: a drive shaft including a first finger and a second finger spaced from each other. The first finger includes a first arm portion and a second arm portion extending from its rotation center with a prescribed angle therebetween so as to be distanced from each other. The second finger includes a third arm portion and a fourth arm portion extending from its rotation center with a prescribed angle therebetween so as to be distanced from each other. The second arm portion and the fourth arm portion are distanced from each other when the first arm portion and the third arm portion overlap in the axial direction of the drive shaft. The robot apparatus can further improve productivity without incurring size increase and high cost.

4 Claims, 27 Drawing Sheets

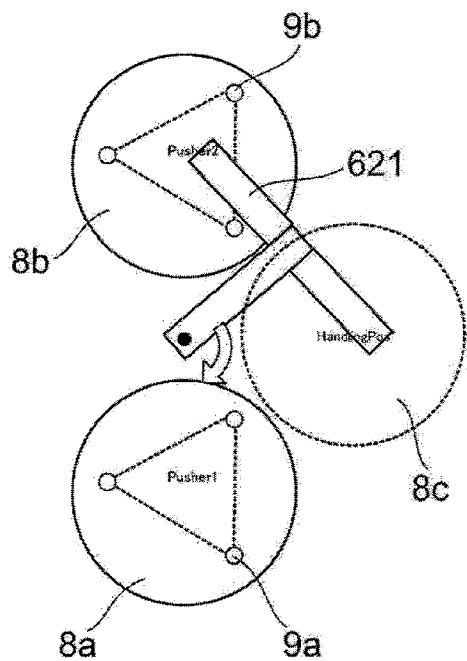 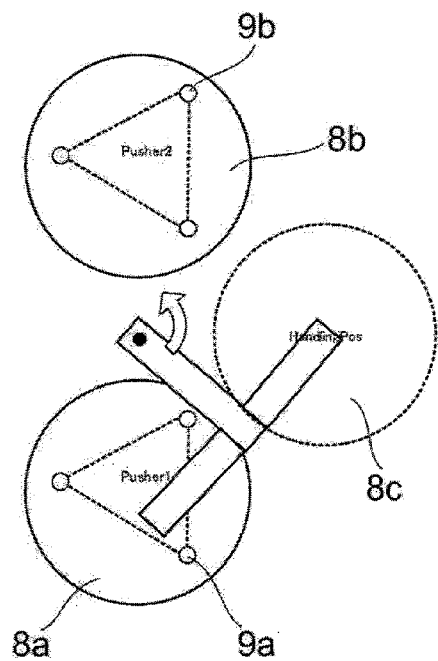
FIG. 7A  FIG. 7B
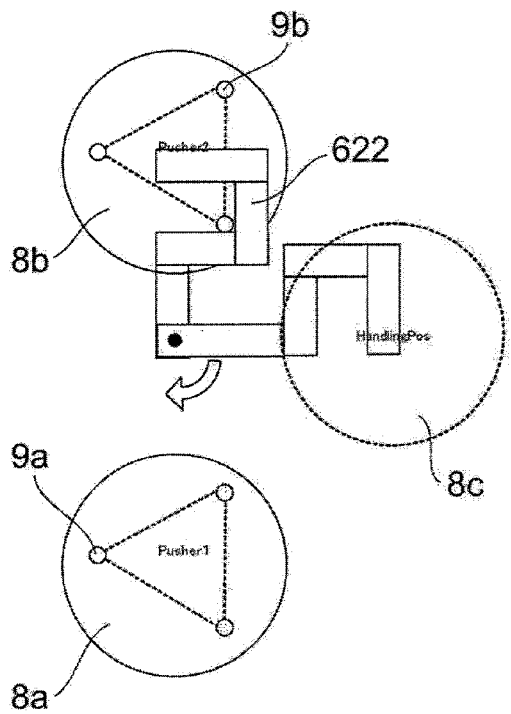 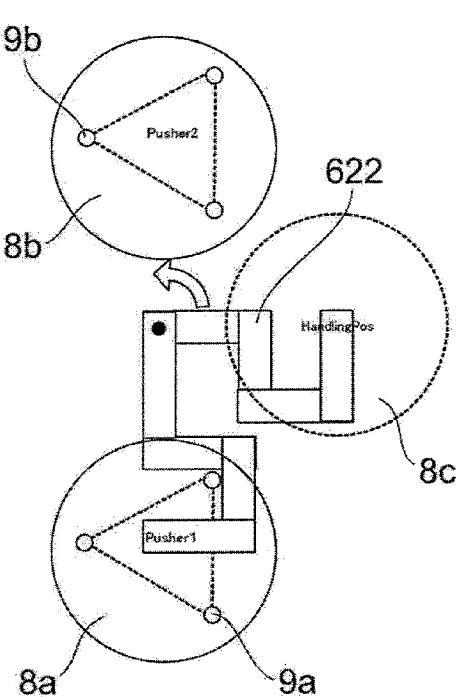
FIG. 8A  FIG. 8B

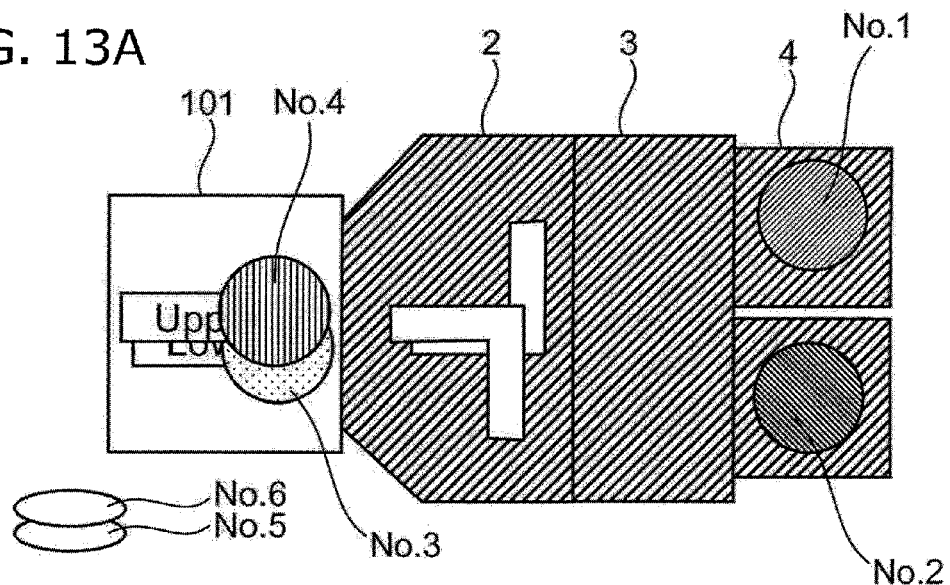
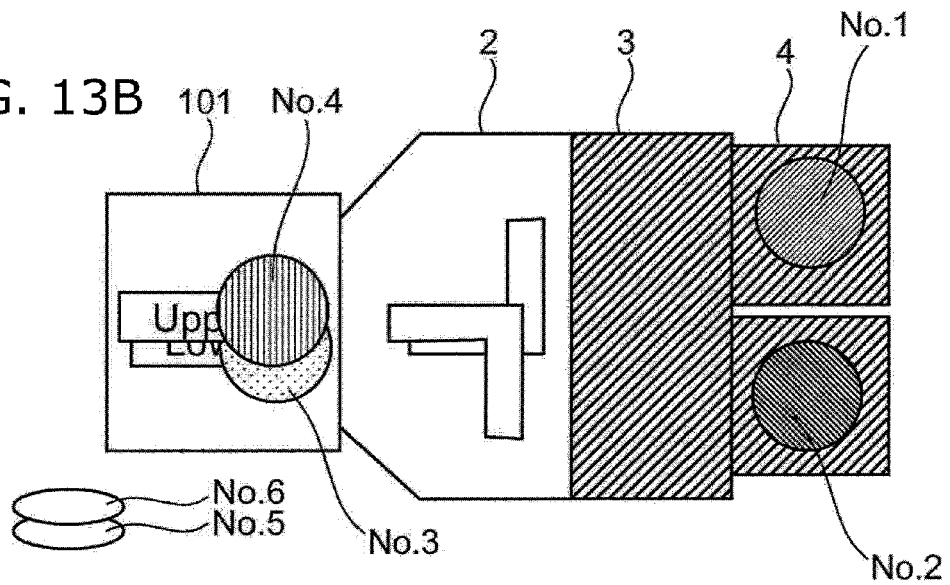

ROBOT APPARATUS AND PROCESSING APPARATUS PROVIDED THEREWITH, ASHING SYSTEM, AND ASHING METHOD

TECHNICAL FIELD

This invention relates to a robot apparatus for transferring a workpiece and a processing apparatus provided therewith, an ashing system, and an ashing method.

BACKGROUND ART

For example, in a process for forming a circuit pattern and the like on a workpiece, such as a glass substrate for liquid crystal display devices and a wafer for semiconductor devices, it is necessary to perform various processing steps on the workpiece. Thus, a so-called multi-chamber system is proposed, in which a plurality of processing chambers are provided to perform processing in each chamber simultaneously or successively.

In processing a workpiece in a multi-chamber system, a robot apparatus receives an unprocessed workpiece from a supply unit and supplies the workpiece to a processing chamber. After the workpiece is processed in the processing chamber, the robot apparatus receives the workpiece from the processing chamber and hands it over to the next processing chamber or transfers it to another processing unit, for example.

Here, to improve productivity in such processing, a robot apparatus capable of rapidly receiving and supplying a workpiece is proposed (see Patent Document 1).

However, recently, further improvement in productivity has been required in fields being in high demand and requiring volume production, such as the field of semiconductor devices including nonvolatile semiconductor memory elements. Thus, even the technique as disclosed in Patent Document 1 has problems from the viewpoint of productivity improvement.

Patent Document 1: JP-A-H11-135600

DISCLOSURE OF INVENTION

Problems to be Solved by the Invention

This invention provides a robot apparatus and a processing apparatus provided therewith, an ashing system, and an ashing method, which can further improve productivity without incurring size increase and high cost.

Means for Solving the Problems

According to a first aspect of the invention, there is provided a robot apparatus configured to hand over a workpiece by rotating by a prescribed angle a finger including a holding means for holding the workpiece, the robot apparatus including: a drive shaft including a first finger and a second finger spaced from each other, the first finger including a first arm portion and a second arm portion extending from its rotation center with a prescribed angle therebetween so as to be distanced from each other, and the second finger including a third arm portion and a fourth arm portion extending from its rotation center with a prescribed angle therebetween so as to be distanced from each other, wherein the second arm portion and the fourth arm portion are distanced from each other when the first arm portion and the third arm portion overlap in the axial direction of the drive shaft.

According to a second aspect of the invention, there is provided a processing apparatus including: a load lock chamber including a first robot apparatus according to the first aspect of the invention; a processing chamber configured to process a workpiece; and a transfer chamber including a second robot apparatus configured to transfer the workpiece received from the first robot apparatus to the processing chamber.

According to a third aspect of the invention, there is provided an ashing system including: the processing apparatus according to the second aspect of the invention, the processing apparatus being an ashing apparatus; a housing apparatus configured to house wafers; a transfer apparatus configured to simultaneously receive two of the wafers from the housing apparatus and transfer them to the processing apparatus; and a slow cooling means for slowly cooling the wafer ashed by the ashing apparatus.

According to a fourth aspect of the invention, there is provided an ashing method including: rotating the first finger and the second finger of the robot apparatus according to the first aspect of the invention provided in the load lock chamber when the wafer is not placed on the first finger and the second finger; and handing over the wafer after ashing to the arm portion identical to the arm portion used in transferring the wafer before ashing.

BRIEF DESCRIPTION OF THE DRAWINGS

FIG. 7 A-B is a schematic view for illustrating the shape of a finger avoiding interference with pusher pins.

FIG. 8 A-B is a schematic view for illustrating the shape of the finger avoiding interference with the pusher pins.

FIG. 13 A-B is a schematic process diagram for describing the comparative example investigated by the inventors.

Figure 1:
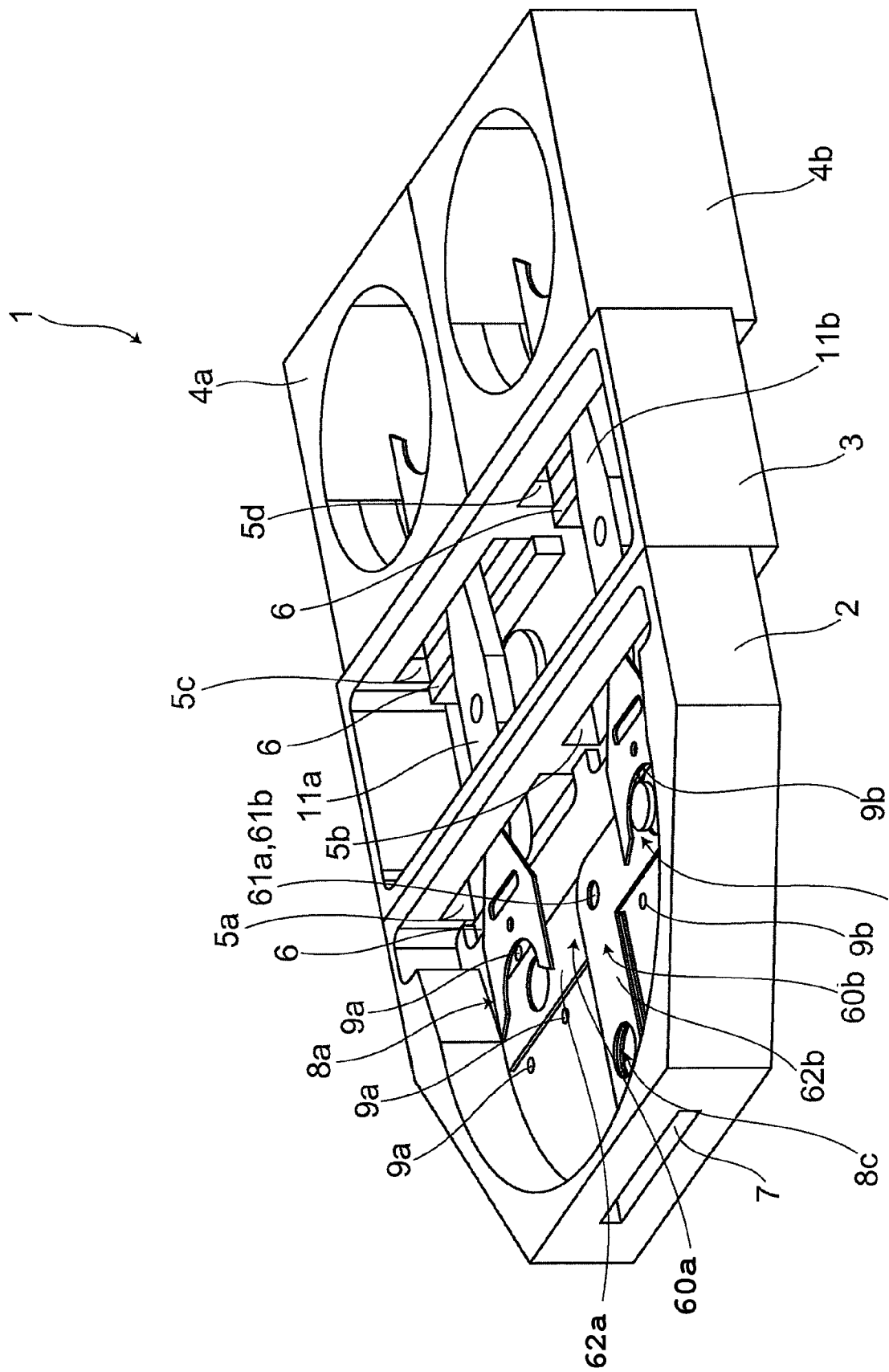
FIG. 1 is a schematic cross-sectional perspective view for illustrating a processing apparatus according to an embodiment of the invention.

DESCRIPTION OF REFERENCE NUMERALS 1 processing apparatus
2 load lock chamber
3 transfer chamber
4 processing chamber
4a processing chamber
4b processing chamber
9a pusher pin
9b pusher pin
11a robot apparatus
11b robot apparatus
47 finger
48 finger
60a robot apparatus
60b robot apparatus
62a finger
62b finger
100 ashing system
101 transfer apparatus
102 slow cooling means
103 housing apparatus
621 finger
622 finger
623 finger
624a finger
624b finger
U wafer
W workpiece

BEST MODE FOR CARRYING OUT THE INVENTION

An embodiment of the invention will now be described with reference to the drawings.

FIG. 1 is a schematic cross-sectional perspective view for illustrating a processing apparatus according to the embodiment of the invention. As shown in FIG. 1, the processing apparatus 1 includes a load lock chamber 2 capable of reducing the pressure therein, a transfer chamber 3, and processing chambers 4a, 4b. A plurality of (at four locations in total in the illustration of FIG. 1) handover gates 5a-5d are formed in parallel in the walls between the load lock chamber 2 and the transfer chamber 3 and between the transfer chamber 3 and the processing chambers 4a, 4b. The load lock chamber 2 and the transfer chamber 3, and the transfer chamber 3 and the processing chambers 4a, 4b are connected through the handover gates 5a-5d so as to allow their internal spaces to communicate with each other. Here, the ceiling of the load lock chamber 2, the transfer chamber 3, and the processing chambers 4a, 4b is hermetically sealed with a ceiling plate, not shown.

A gate valve 6 is protrudably provided below each handover gate 5a-5d and allows each handover gate 5a-5d to be hermetically closed.

Another handover gate 7 is provided in another wall of the load lock chamber 2 (the wall on the side opposed to the transfer chamber 3 side) and can be hermetically closed by an atmospheric valve, not shown.

The configuration of the processing chamber 4a, 4b can be arbitrarily selected in accordance with the workpiece W and the content of processing thereon. For example, they can perform ashing, etching, cleaning, and film formation on a wafer for semiconductor devices, or etching, film formation and the like on a glass substrate for liquid crystal display devices. Here, for convenience of description, a configuration for ashing a wafer is described.

Figure 2:
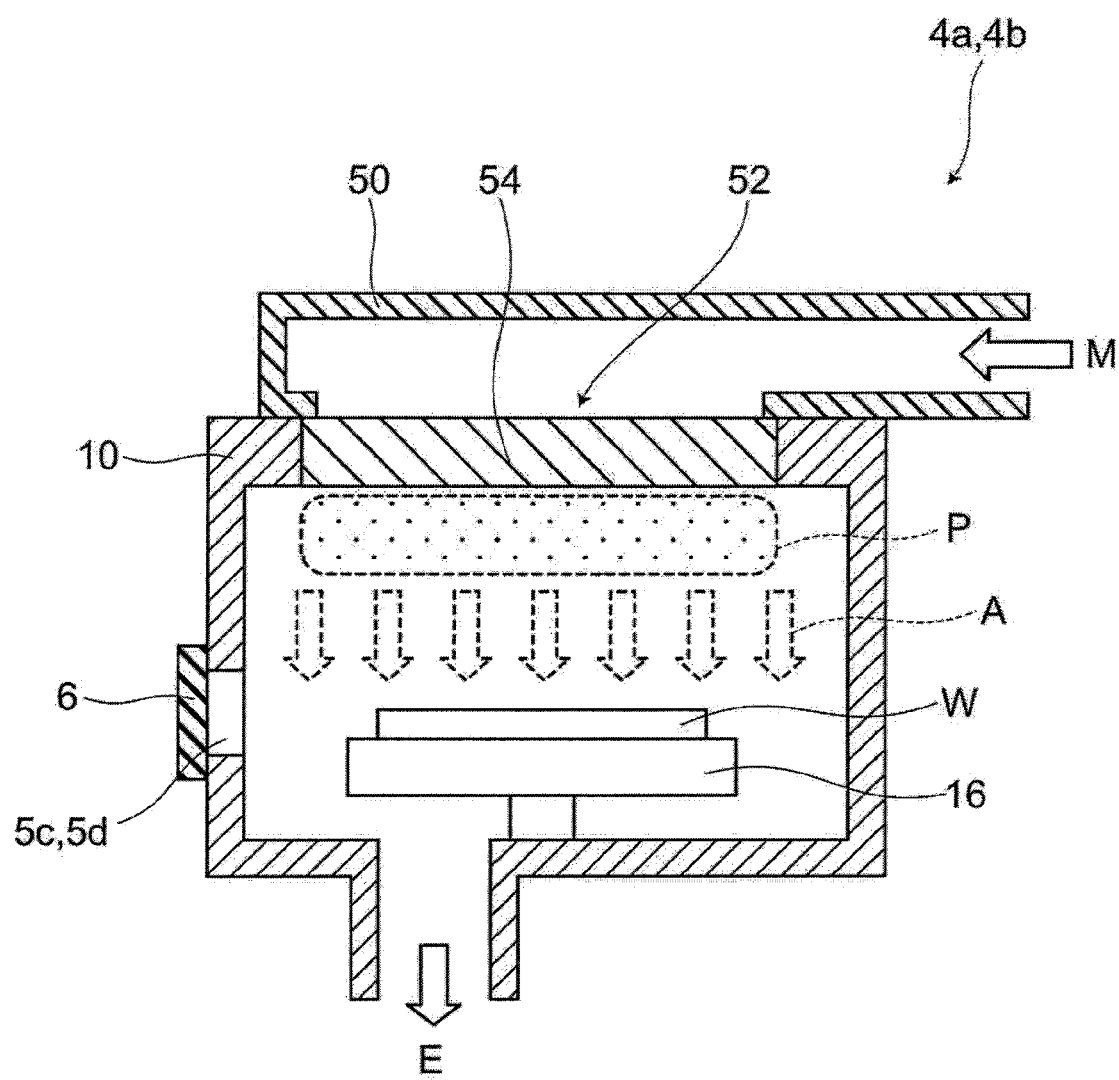
FIG. 2 is a schematic cross-sectional view for illustrating the configuration of a processing chamber.

FIG. 2 is a schematic cross-sectional view for illustrating the configuration of the processing chamber 4a, 4b.

The processing chamber 4a, 4b includes a processing container 10, a waveguide body (transmissive window) 54 provided in the upper surface of this processing container 10 and made of a flat dielectric plate, and a feed waveguide 50 provided outside the waveguide body 54. A stage 16 for allowing a workpiece W such as a wafer to be placed and held thereon in the processing space below the waveguide body 54 is provided inside the processing container 10.

The processing container 10 can maintain a reduced-pressure atmosphere formed by a reduced-pressure evacuation system E, and is suitably provided with a gas feed pipe (not shown) for feeding the processing space with a processing gas.

As described above, the handover gates 5c, 5d are provided in one sidewall of the processing container 10, and the gate valve 6 allows each handover gate 5c, 5d to be hermetically closed.

Next, the operation of the processing chamber 4a, 4b itself is described.

For example, to perform ashing on a surface of a workpiece W using this processing chamber 4a, 4b, first, the workpiece W is placed on the stage 16 with its surface facing upward. Its transfer into and out of the processing chamber 4a, 4b is described later.

Next, the processing space is turned into a reduced-pressure condition by the reduced-pressure evacuation system E. Then, a prescribed ashing gas as a processing gas is introduced into this processing space. Subsequently, while an atmosphere of the processing gas is formed in the processing space, a microwave M of e.g. 2.45 GHz is introduced from a microwave power supply, not shown, into the feed waveguide 50. The microwave M propagated in the waveguide 50 is emitted through a slot antenna 52 toward the waveguide body 54. The waveguide body 54 is made of a dielectric such as quartz and alumina. The microwave M is propagated on the surface of the waveguide body 54 as a surface wave and emitted into the processing space in the chamber 10. A plasma P of the processing gas is formed by the energy of the microwave M thus emitted into the processing space. When the electron density in the plasma P thus generated reaches or exceeds the density (cutoff density) capable of shielding the microwave M supplied through the waveguide body 54, the microwave M is reflected before reaching a certain distance (skin depth) d from the lower surface of the waveguide body 54 toward the processing space in the chamber, and a standing wave of the microwave M is formed.

Then, the reflecting surface of the microwave M serves as a plasma excitation surface, and a stable plasma P is excited at this plasma excitation surface. In the stable plasma P excited at this plasma excitation surface, ions and electrons collide with molecules of the processing gas to generate excited active species (plasma products) such as excited atoms, molecules, and free radicals. These plasma products diffuse in the processing space as indicated by the arrow A and fly onto the surface of the workpiece W, where ashing is performed. It is noted that although this invention is suitable for plasma ashing as described later, the processing chamber 4a, 4b can also serve for plasma processing such as etching, thin film deposition, surface modification, and plasma doping, atmospheric plasma processing, and the so-called wet processing such as cleaning.

Inside the transfer chamber 3, a robot apparatus 11a is provided between the handover gate 5a and the handover gate 5c, and a robot apparatus 11b is provided between the handover gate 5b and the handover gate 5d.

Figure 3:
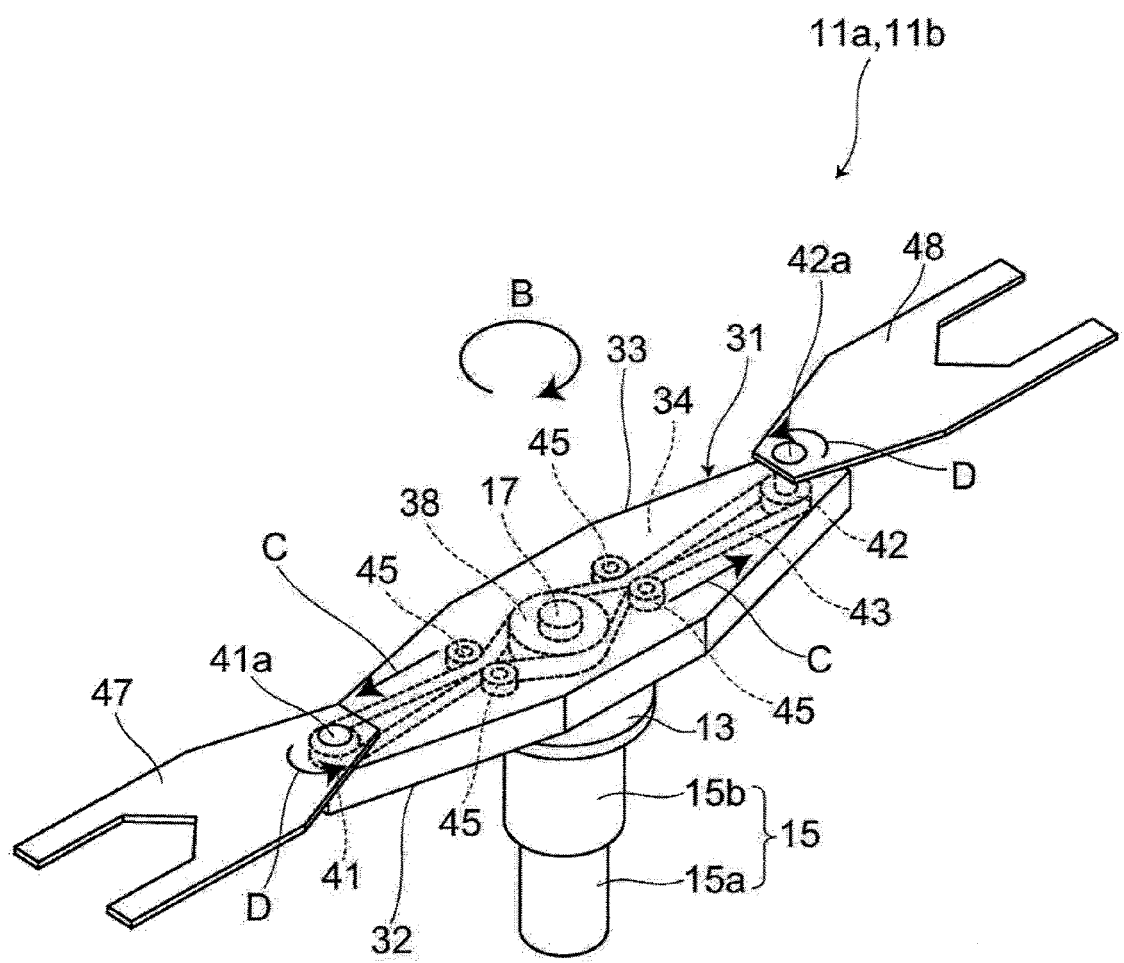
FIG. 3 is a schematic perspective view for illustrating a robot apparatus.

FIG. 3 is a schematic perspective view for illustrating the robot apparatus 11a, 11b.

As shown in FIG. 3, the robot apparatus 11a, 11b includes an attachment body 13 to be hermetically fitted and fixed into an attachment hole, not shown, formed in the bottom wall of the transfer chamber 3. A drive source 15 is attached to the lower surface side of this attachment body 13. This drive source 15 includes a motor 15a and a speed reducer 15b integrated with each other.

A drive shaft 17 is connected to the output shaft of the speed reducer 15b through a coupling, not shown. This drive shaft 17 is rotatably supported by a bearing, not shown, provided in the attachment body 13, and its tip portion is projected into the transfer chamber 3.

The longitudinal center portion of an arm body 31 is coupled and fixed to the tip portion of the drive shaft 17 projected into the transfer chamber 3. The arm body 31 includes a lower casing 32 and an upper casing 33 joined together, and a housing space 34 is formed between these joining surfaces.

The tip portion of the drive shaft 17 is projected into the housing space 34. The tip surface of the drive shaft 17 is joined with the inner surface of the upper casing 33, and this joining portion is fixed with a screw or the like. Furthermore, a fixed pulley 38 is provided at the longitudinal center portion of the arm body 31. This fixed pulley 38 is relatively rotatable with respect to the drive shaft 17, and attached and fixed to the tip portion of a pressing member, not shown, projected into the housing space 34 and integrated with the attachment body 13.

A first rotary pulley 41 is rotatably provided in one longitudinal end portion of the housing space 34, and a second rotary pulley 42 is rotatably provided in the other end portion. An endless timing belt 43 as a power transmission means is stretched between the pair of rotary pulleys 41, 42 and the fixed pulley 38. A pair of tension rollers 45 attached to an adjustable plate, not shown, is provided between the fixed pulley 38 and each rotary pulley 41, 42 with a prescribed spacing therebetween. This adjustable plate can be adjusted in its position along the longitudinal direction of the arm body 31. This allows the tension of the timing belt 43 to be adjusted.

The gear ratio (outer diameter dimension ratio) of the fixed pulley 38 to the rotary pulley 41, 42 is set to 2 to 1. Accordingly, when the fixed pulley 38 and the rotary pulley 41, 42 are relatively rotated, their rotation ratio is equal to 2 to 1.

An attachment shaft 41a, 42a is provided at the upper surface of the rotary pulley 41, 42. The attachment shaft 41a, 42a is projected outward from the upper casing 33. A first finger 47 is attached to the attachment shaft 41a of the first rotary pulley 41, and a second finger 48 is attached to the attachment shaft 42a of the second rotary pulley 42.

The attachment shaft 41a of the first rotary pulley 41 is designed to be shorter than the attachment shaft 42a of the second rotary pulley 42. Accordingly, the first finger 47 is located lower in height than the second finger 48.

Because the first finger 47 and the second finger 48 differ in height, even if each finger 47, 48 rotates by 180 degrees from the state of being located on the longitudinal extension line of the arm body 31 to the state of being located above the arm body 31, these fingers 47, 48 do not interfere with each other, but are vertically spaced from and opposed to each other with a prescribed spacing therebetween.

Next, the operation of the robot apparatus 11a, 11b itself is described.

When the drive source 15 is operated to rotate the drive shaft 17, the arm body 31 interlocks with the rotation. In FIG. 3, when the arm body 31 rotates in the arrow B direction, the timing belt 43 travels in the arrow C direction because the fixed pulley 38 does not rotate. Accordingly, the pair of rotary pulleys 41, 42 rotates in the arrow D direction, and the fingers 47, 48 rotate interlocking with this rotation.

The state of the fingers 47, 48 vertically spaced from and overlapping with each other above the arm body 31 is hereinafter referred to as the state of the arm body 31 at a rotation angle of 0 degrees. If the arm body 31 is rotated from a rotation angle of 0 degrees in the arrow B direction by 90 degrees, the fingers 47, 48 rotate by 180 degrees, and hence are located on the longitudinal extension line of the arm body 31. That is, the fingers 47, 48 are projected from both ends of the arm body 31 and are collinear with the arm body 31, resulting in the state shown in FIG. 3.

The load lock chamber 2 includes a first handling position 8a, which is the position opposed to the handover gate 5a, a second handling position 8b, which is the position opposed to the handover gate 5b, and a handling position 8c, which is the position opposed to the handover gate 7.

The first handling position 8a and the second handling position 8b are provided at positions spaced from the wall between the load lock chamber 2 and the transfer chamber 3 by an equal dimension and being parallel to this wall. The handling position 8c is provided on a line passing midway between the first handling position 8a and the second handling position 8b and being perpendicular to the aforementioned wall.

Three pusher pins 9a, 9b movable vertically are provided at the handling positions 8a, 8b, respectively. When handover of a workpiece W (such as a wafer) described later is not performed, each pusher pin 9a, 9b is located at the descent end position. When the workpiece W is handed over, each pusher pin 9a, 9b rises to the ascent end position, allowing the workpiece W to be placed on the upper end surface of the pusher pins 9a, 9b.

On the other hand, as shown in FIG. 1, robot apparatuses 60a, 60b are provided between the first handling position 8a and the second handling position 8b in the load lock chamber 2. The robot apparatus 60a has a base portion, not shown. This base portion is attached to the bottom wall of the load lock chamber 2, and to the tip of a drive shaft 61a projected from the base portion is coupled the base portion of a generally L shaped finger 62a. The robot apparatus 60b has a base portion, not shown. This base portion is attached to the bottom wall of the load lock chamber 2, and to the tip of a drive shaft 61b projected from the base portion is coupled the base portion of a generally L shaped finger 62b. Each finger 62a, 62b is provided with two arm portions extending from its rotation center in a generally L shape, and a holding means, not shown, is provided near the extending end of the arm portion so that a workpiece W can be placed and held thereon (see FIG. 5).

The drive shafts 61a, 61b are provided so as to penetrate through the bottom wall of the load lock chamber 2, and separate drive sources are respectively connected thereto. Here, alternatively, power may be transmitted from one drive source through gears and the like to each drive shaft 61a, 61b.

The drive shafts 61a, 61b are generally at the center between the first handling position 8a and the second handling position 8b. The drive shaft 61a is provided coaxially around the drive shaft 61b. The tip of the drive shaft 61a with the finger 62a coupled thereto is designed to be shorter (lower) than that of the drive shaft 61b. Accordingly, the finger 62a is located lower in height from the bottom wall of the load lock chamber 2 than the finger 62b.

As described above, the finger 62a, 62b is generally L shaped. Hence, when the finger 62a, 62b rotates by 90°, the tip of the finger 62a, 62b moves between the handling positions 8a and 8c, or between 8b and 8c. Here, the height of the fingers 62a, 62b is designed at a position higher than the bottom wall of the load lock chamber 2 and lower than the finger 47 of the robot apparatuses 11a, 11b. This allows the finger 62a, 62b to be inserted below the finger 47 even if the finger 47 is located above the first handling position 8a or the second handling position 8b.

As described above, in this embodiment, at the handling position 8c in the load lock chamber 2, two wafers U carried in with a vertical spacing therebetween can be simultaneously received at one end portion of the respective fingers, which can then be rotated by 90° to distribute the wafers U to two planar locations (first handling position 8a and second handling position 8b). At the same time, two processed wafers U can be simultaneously received by the other end portion of the respective fingers at two planar locations (first handling position 8a and second handling position 8b), and can then be returned to the handling position 8c with the vertical spacing therebetween in conjunction with the rotation of the aforementioned respective fingers.

That is, the robot apparatuses 60a, 60b according to this embodiment can simultaneously supply two wafers U to the side of the two processing chambers 4a, 4b. In parallel thereto, the robot apparatuses 60a, 60b can simultaneously receive processed wafers U from the side of the processing chambers 4a, 4b, and can hand them over to the transfer apparatus 101 (see FIG. 4) described later so that they are stacked with a vertical spacing therebetween. Thus, as compared with the case where the wafers U are individually supplied to and carried out of the processing chambers 4a, 4b, the time required therefor can be generally halved.

Next, the operation of the robot apparatus 60a, 60b itself is described.

When a drive source, not shown, is operated to rotate the drive shafts 61a, 61b, the fingers 62a, 62b interlock with the rotation. The finger 62a and finger 62b rotate by 90° in directions opposite to each other. As described above, the finger 62a, 62b is generally L shaped. Hence, when the finger 62a, 62b rotates by 90°, the tip of the finger 62a, 62b moves between the handling positions 8a and 8c, or between 8b and 8c. This allows workpieces W to be handed over at each handling position.

Next, a description is given of the case where the processing apparatus 1 of the aforementioned configuration is used for continuously ashing wafers U.

Figure 4:
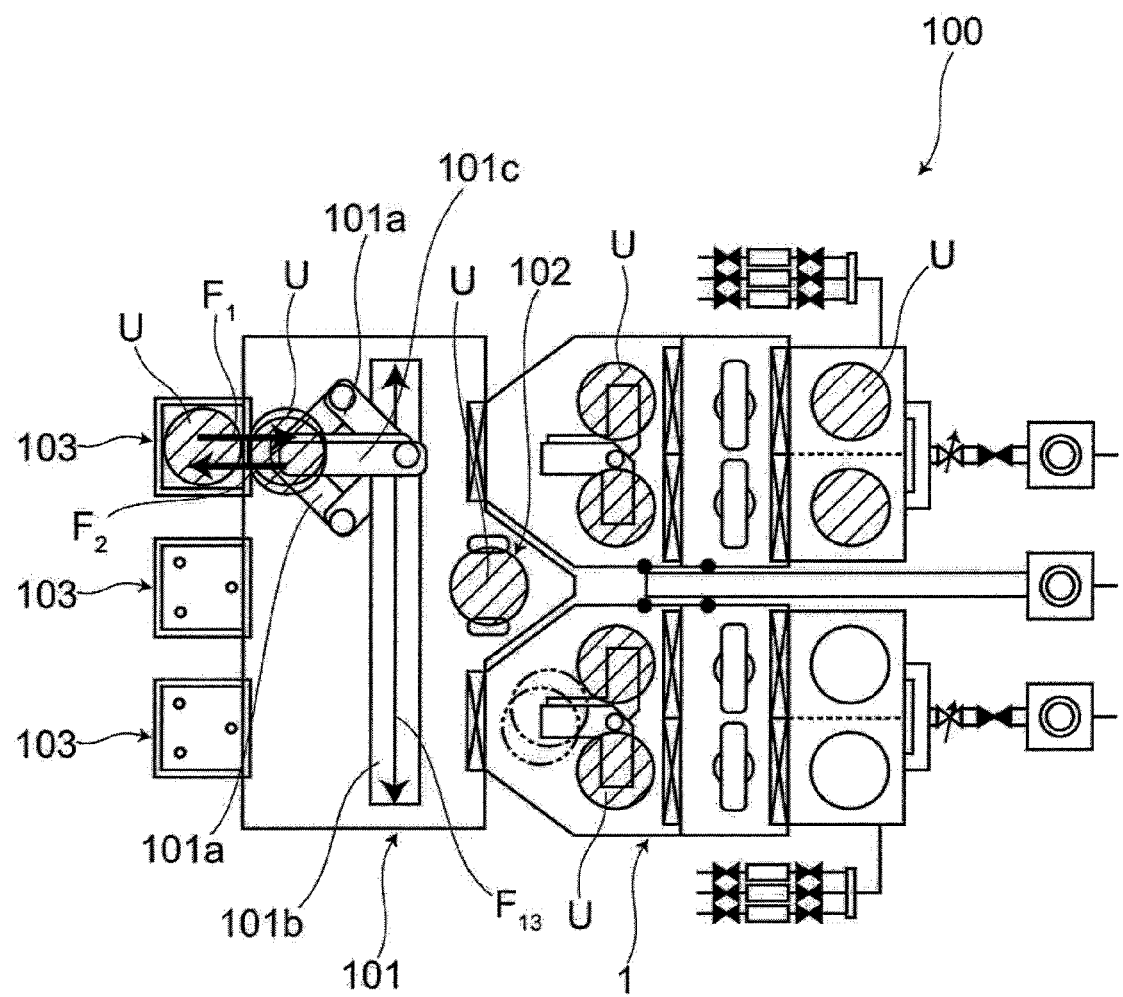
FIG. 4 is a schematic view for illustrating an ashing system including the processing apparatus according to this embodiment.

FIG. 4 is a schematic view for illustrating an ashing system 100 including the processing apparatus 1 according to this embodiment.

As shown in FIG. 4, the ashing system 100 includes the aforementioned processing apparatuses 1, a transfer apparatus 101, a slow cooling means 102, and a housing apparatuses 103.

The transfer apparatus 101 includes arms 101a having vertically spaced joints. A holding means, not shown, is provided at the tip of the arm 101a so that a wafer U, or workpiece, can be placed and held thereon. Furthermore, an arm base 10c, on which the arm 101a is provided, is connected to a movable means 101b so that the arm base 101c can move in the direction of the arrow $F_{13}$. Hence, the arm 101a is extended and contracted in a folding manner, and two wafers U are simultaneously placed and held at the tip of the arms 101a and, as-is, can be moved in the direction of the arrow $F_{13}$. Furthermore, although not shown, a means for adjusting the rotation direction and vertical position of the wafer U, and a means for turning the direction of the arms 101a by rotating the base portion of the arm 101as are provided.

The slow cooling means 102 serves to slowly cool the ashed wafer U. Ashing results in increasing the temperature of the wafer U, or workpiece. Hence, when it is housed in a resin cassette or the like, it needs to be cooled to decrease its temperature. In this regard, if the wafer U is rapidly cooled to shorten the processing time, the wafer U may crack, for example, in the case of the so-called laminated wafer in which a support substrate (handle wafer) and an active substrate (active wafer) are laminated.

As a result of investigations, the inventors has found that if a slow cooling means 102 is provided in the ashing system 100 to cool the wafer U by natural heat dissipation and the like, the wafer U can be prevented from cracking and the like, and other wafers U can be ashed simultaneously during the cooling time, allowing the productivity to be improved. By way of example, a housing means made of a heat-resistant material for allowing a wafer U to be placed and held thereon is provided. Here, although the slow cooling means 102 may allow one wafer U to be placed and held thereon, it may allow a plurality of wafers U to be placed and held thereon in a stacked (multistage) configuration or in a planar configuration in view of the tradeoff between the ashing time and the slow cooling time.

The housing apparatus 103 serves to house wafers U before and after ashing, and can illustratively be a wafer carrier capable of housing wafers U in a stacked (multistage) configuration. Specifically, it can be a FOUP (front-opening unified pod), which is a front-opening carrier used to transfer and retain wafers U in a semiconductor plant based on the mini-environment system. An opening/closing device for the door in front of the carrier is also provided as needed.

Next, the function of the ashing system 100 is described with reference to FIG. 4 to 6.

Figure 5:
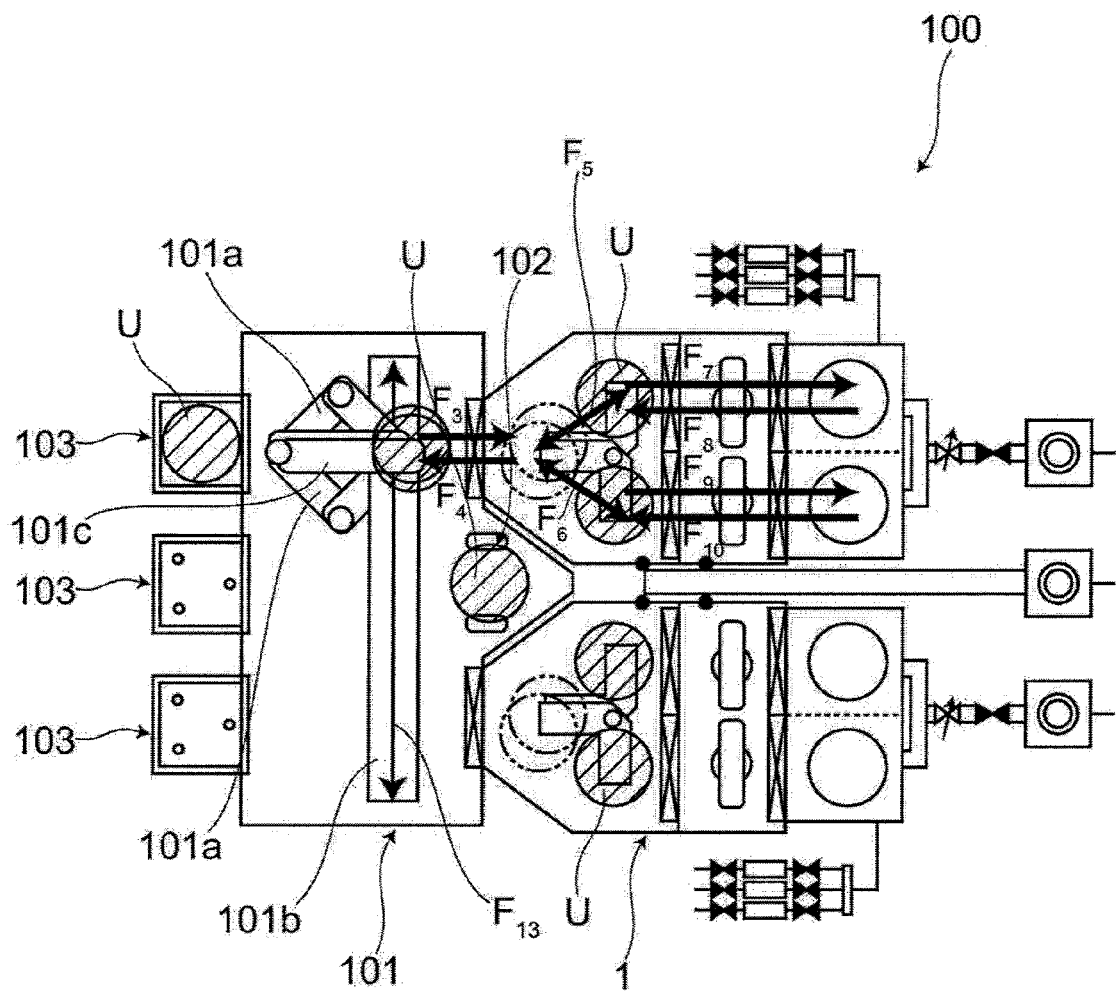
FIG. 5 is a schematic view for illustrating the function of the ashing system.
Figure 6:
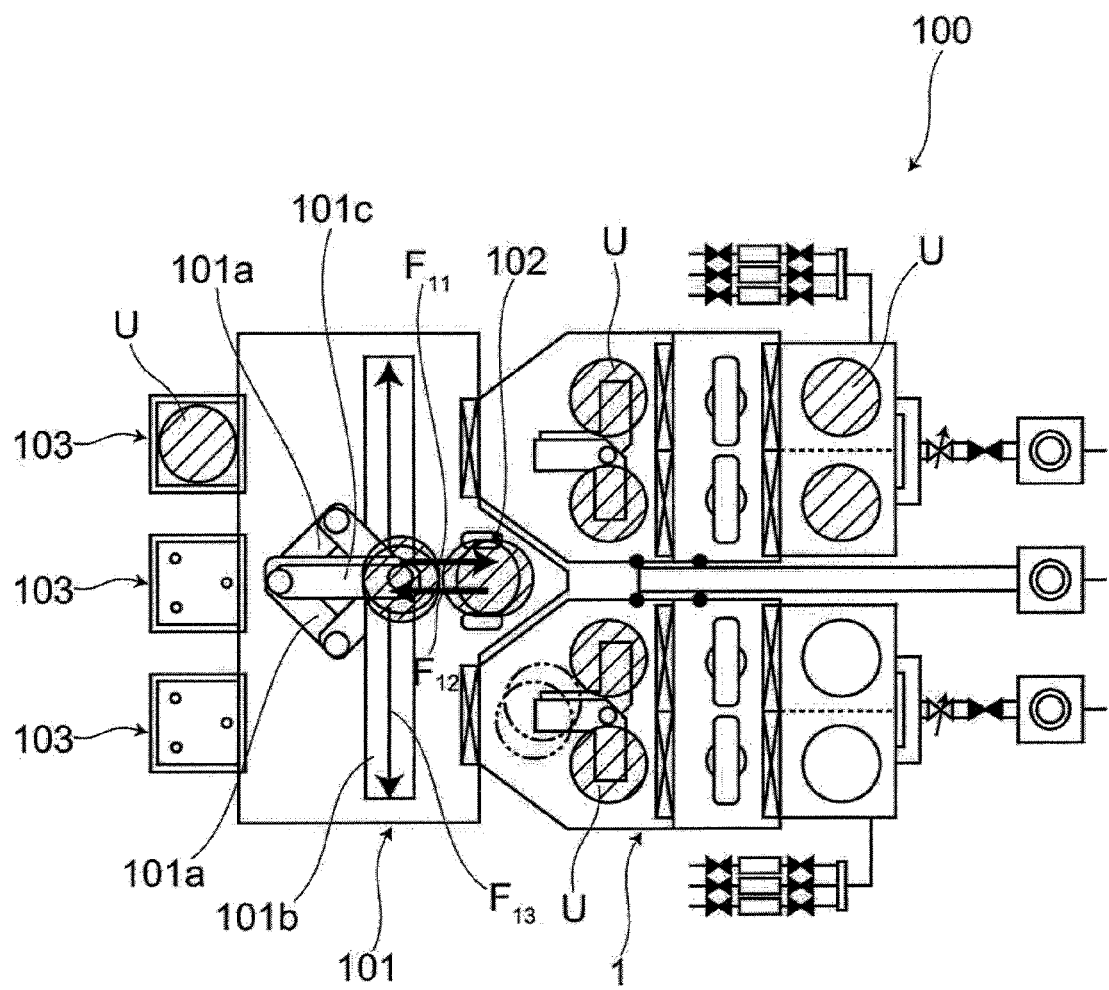
FIG. 6 is a schematic view for illustrating the function of the ashing system.

FIG. 5 and 6 are schematic views for illustrating the function of the ashing system 100.

First, as shown in FIG. 4, the arm base 101c of the transfer apparatus 101 is moved to the front of a prescribed housing apparatus 103. Here, the door of the housing apparatus 103 is opened by the opening/closing device, not shown. Next, the arms 101a are extended in a folding manner in the direction of the arrow $F_2$ to receive two wafers U with a prescribed vertical spacing therebetween. Then, the arms 101a are contracted in a folding manner in the direction of the arrow $F_1$ to receive the wafers U from the housing apparatus 103.

Next, as shown in FIG. 5, the arm 101a is rotated by 180° and directed to the processing apparatus 1. At this time, the position of the arm base 101c is adjusted as needed so as to come in front of the processing apparatus 1.

Next, the arms 101a are extended in a folding manner in the direction of the arrow $F_3$ to hand over the two wafers U with the prescribed vertical spacing therebetween to the fingers 62a, 62b of the robot apparatuses 60a, 60b. Subsequently, the arms 101a are contracted in a folding manner in the direction of the arrow $F_4$ to retract from the load lock chamber 2. The load lock chamber 2 is hermetically closed by the gate valve 6, and the pressure therein is reduced to a prescribed value.

Next, the fingers 62a, 62b are rotated by 90° in the direction of the arrows $F_5$, $F_6$ to distribute the two wafers U to the first handling position 8a and the second handling position 8b. At the first handling position 8a and the second handling position 8b, the wafers U are lifted to a prescribed height by the pusher pins 9a, 9b.

Next, the finger 47 or the finger 48 is inserted below the lifted wafer U. Subsequently, the pusher pins 9a, 9b are moved down to hand over the wafer U onto the finger 47 or the finger 48.

Next, the robot apparatuses 11a, 11b are rotated and transferred in the transfer chamber 3 in the direction of the arrow $F_7$, $F_9$ (toward the processing chambers 4a, 4b), and the wafers U are carried into the processing chambers 4a, 4b.

Next, the wafer U is handed over to the stage 16 in the processing chamber 4a, 4b by pusher pins or the like, not shown. After the robot apparatus 11a, 11b is retracted, the processing chamber 4a, 4b is hermetically closed by the gate valve 6, and the aforementioned ashing is performed. The condition for ashing and the like can be based on known techniques, and hence the description thereof is omitted.

The ashed wafer U is handed over to the arms 101a of the transfer apparatus 101 in reverse sequence to the foregoing. That is, it is transferred in the direction of the arrows $F_8/F_{10}$, $F_5/F_6$, and $F_4$ in FIG. 5 and handed over to the arms 101a of the transfer apparatus 101.

Next, as shown in FIG. 6, the arm base 101c is moved to the front of the slow cooling means 102, and the arms 101a are extended in a folding manner in the direction of the arrow $F_{11}$ to hand over the two wafers U with the prescribed vertical spacing therebetween to the slow cooling means 102. Then, if there is any wafer U which has finished slow cooling, it is received, and the arms 101a are contracted in a folding manner in the direction of the arrow $F_{12}$ to retract from the slow cooling means 102.

Next, the arm base 101c is moved to the front of the housing apparatus 103, and the arms 101a are rotated by 180° and extended in a folding manner in the direction of the arrow $F_2$ to hand over the two wafers U with the prescribed vertical spacing therebetween to the housing apparatus 103. Here, the control is designed so that the wafer U carried out of the housing apparatus 103 is housed again in the same position. Subsequently, if necessary, the aforementioned sequence is repeated to continuously perform ashing.

Here, as described above, wafers U are handed over between the finger 62a, 62b and the finger 47, 48 by vertically moving the pusher pins 9a, 9b. Hence, when the pusher pins 9a, 9b are moved up, the finger 62a, 62b cannot be rotated, and a waiting time may occur.

As a result of investigations, the inventors has found that if the fingers of the robot apparatuses 60a, 60b have a shape avoiding interference with the pusher pins 9a, 9b despite their rotation, the waiting time can be eliminated.

Figure 9:
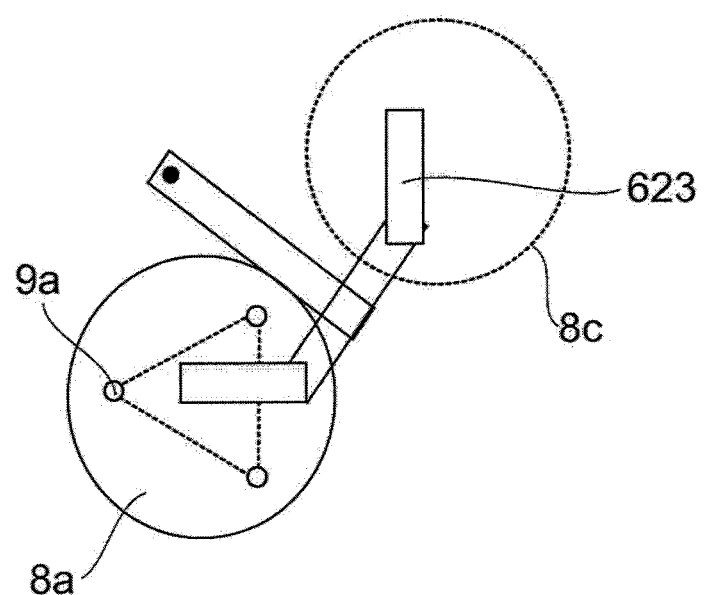
FIG. 9 is a schematic view for illustrating the shape of the finger avoiding interference with the pusher pins.

FIG. 7 to 9 are schematic views for illustrating the shape of the finger avoiding interference with the pusher pins 9a, 9b.

Here, to avoid complicating the figures, only the finger on the robot apparatus 60b side (upper side) is illustrated, and the illustration of the finger on the robot apparatus 60a side (lower side) is omitted.

FIG. 7 illustrates a finger 621 having a generally T shape so as to avoid interference with the pusher pins 9a, 9b. FIG. 7A shows the finger 621 at the second handling position 8b and the handling position 8c. FIG. 7B shows the finger 621 at the first handling position 8a and the handling position 8c.

FIG. 8 illustrates a finger 622 with its tip portion curved in a square U shape.

FIG. 8A shows the finger 622 at the second handling position 8b and the handling position 8c. FIG. 8B shows the finger 622 at the first handling position 8a and the handling position 8c.

FIG. 9 illustrates a finger 623 having a generally T shape with its tip portion bent toward the rotation center. Like those described above, the state of the finger 623 at the second handling position 8b and the handling position 8c is symmetric to that at the first handling position 8a and the handling position 8c, and hence the illustration thereof is omitted.

Here, in the field of semiconductor device manufacturing, from necessity of production control, quality control and the like, the wafer U carried out of the housing apparatus 103 needs to be housed again at the same position in the same housing apparatus 103. However, this may be violated in the operation of the aforementioned ashing system 100, consuming extra time and effort, for example, to relocate the wafer U at the correct position.

FIG. 10 to 18 are schematic process diagrams for describing a comparative example investigated by the inventors. As shown in FIG. 10A, six wafers, from No. 1 to No. 6 sequentially from bottom, are housed in the housing apparatus 103. Here, the hatched portion of the ashing system in the figure indicates a reduced-pressure condition.

Figure 10A:
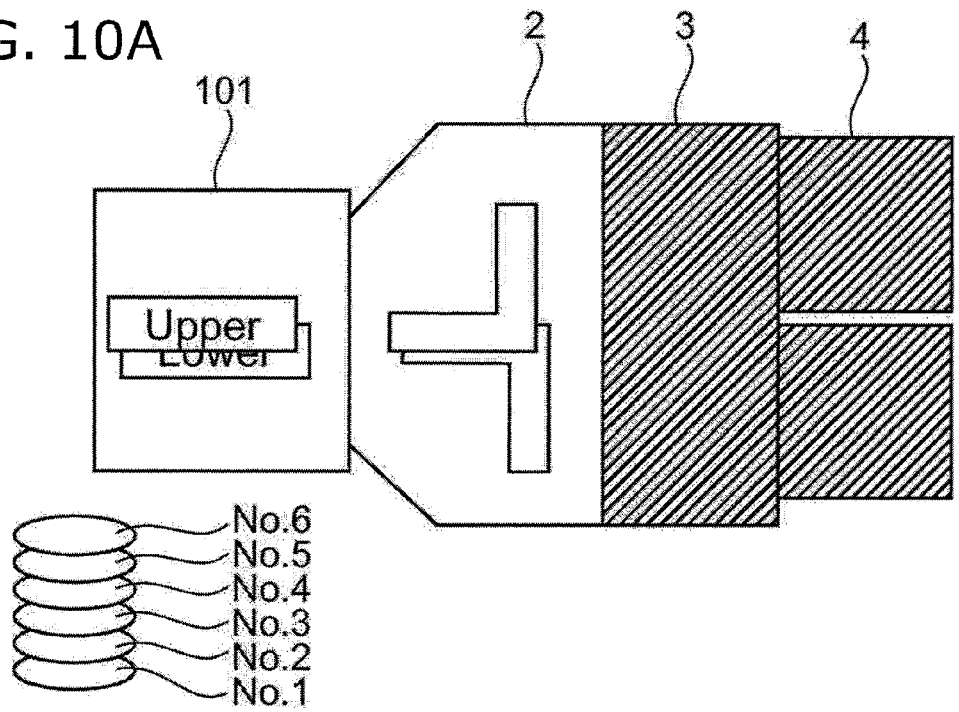
FIG. 10 A-B is a schematic process diagram for describing a comparative example investigated by the inventors.
Figure 10B:
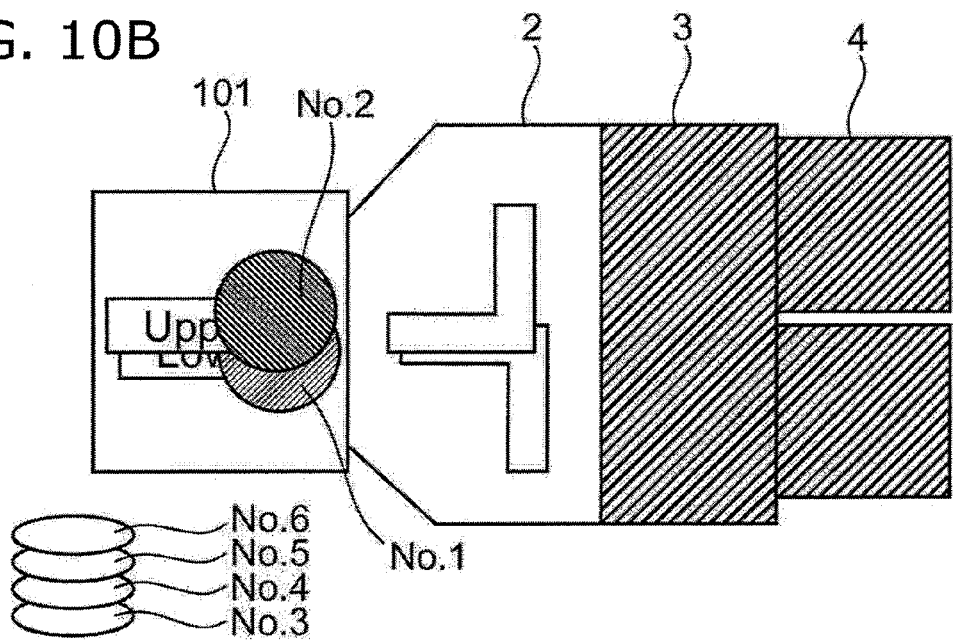

Next, as shown in FIG. 10B, the No. 1 and No. 2 wafer U housed in the housing apparatus 103 are extracted by the transfer apparatus 101 and transferred to the front of the load lock chamber 2.

Figure 11A:
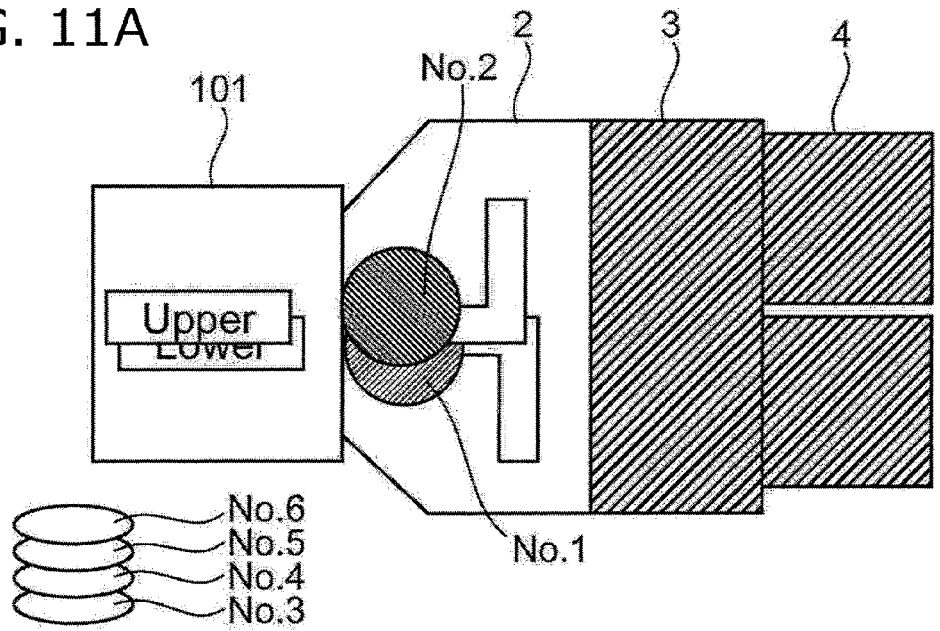
FIG. 11 A-B is a schematic process diagram for describing the comparative example investigated by the inventors.
Figure 11B:
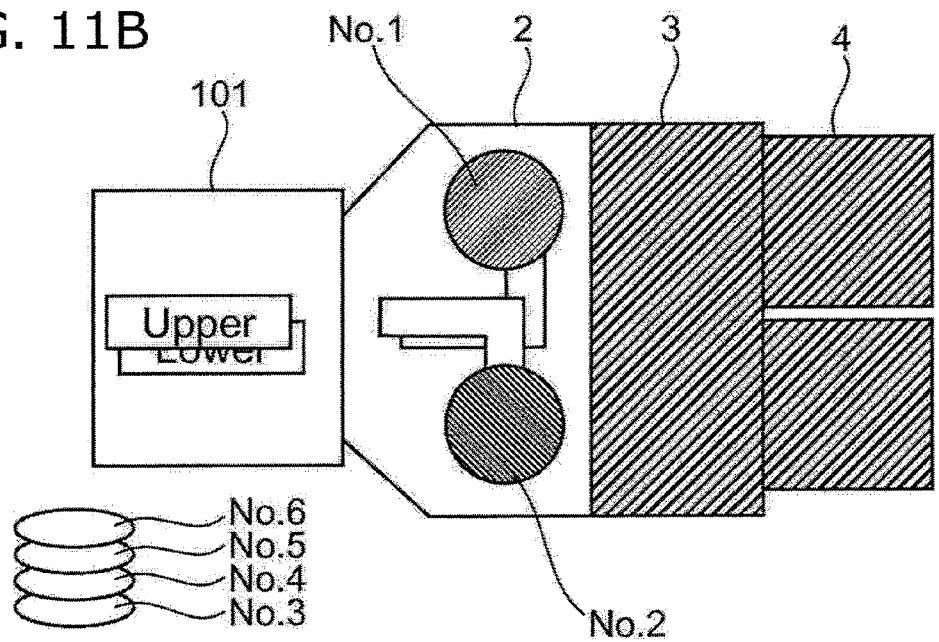

Next, as shown in FIG. 11A, the No. 2 wafer U is handed over to the upper finger of the robot apparatus provided in the load lock chamber, and the No. 1 wafer U is handed over to the lower finger. Subsequently, as shown in FIG. 11B, the upper finger and the lower finger are rotated by 90°, and these wafers U are transferred to the first handling position 8a and the second handling position 8b.

Figure 12A:
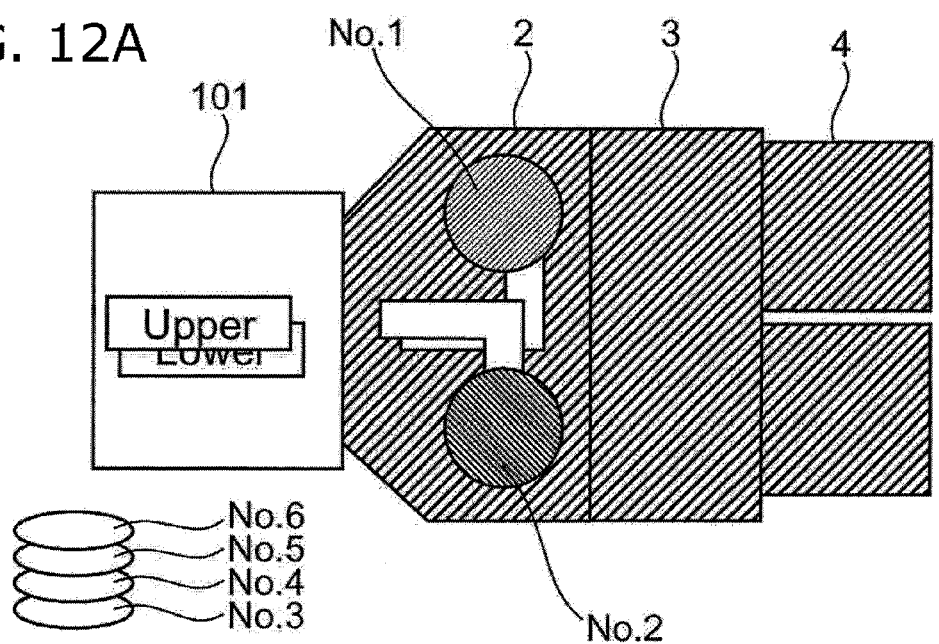
FIG. 12 A-B is a schematic process diagram for describing the comparative example investigated by the inventors.
Figure 12B:
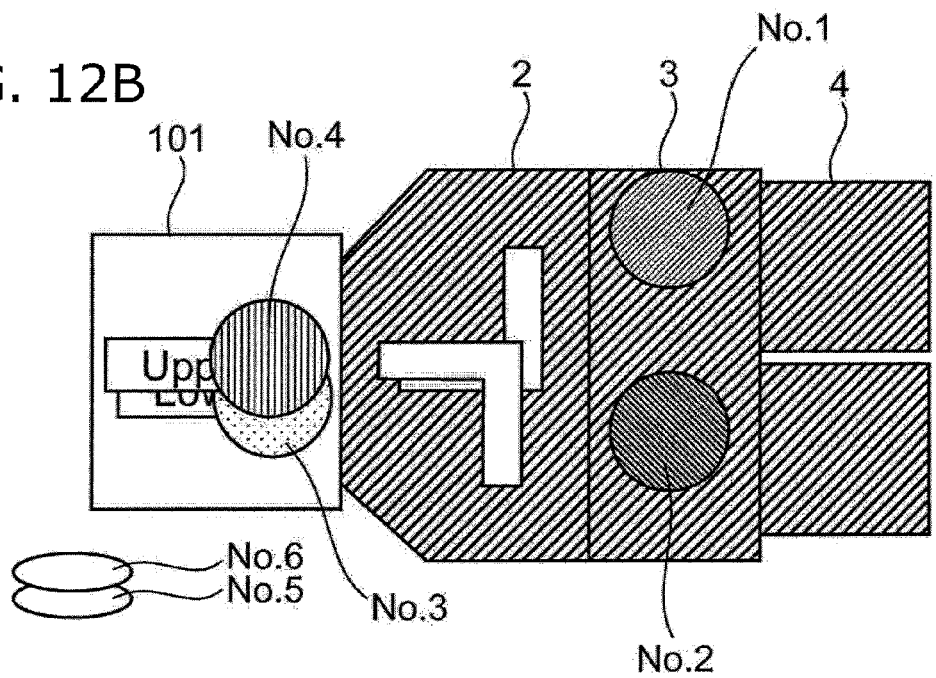

Next, as shown in FIG. 12A, the pressure in the load lock chamber 2 is reduced to a prescribed value. Subsequently, as shown in FIG. 12B, the No. 1 and No. 2 wafer U are handed over to the finger of the robot apparatuses provided in the transfer chamber. In parallel thereto, in the aforementioned sequence, the No. 3 and No. 4 wafer U are extracted from the housing apparatus 103 and transferred to the front of the load lock chamber 2.

Next, as shown in FIG. 13A, the No. 1 and No. 2 wafer U are carried into the processing chambers 4, placed on the stage, and subjected to ashing. Then, as shown in FIG. 13B, the load lock chamber 2 is returned to the atmospheric pressure.

Figure 14A:
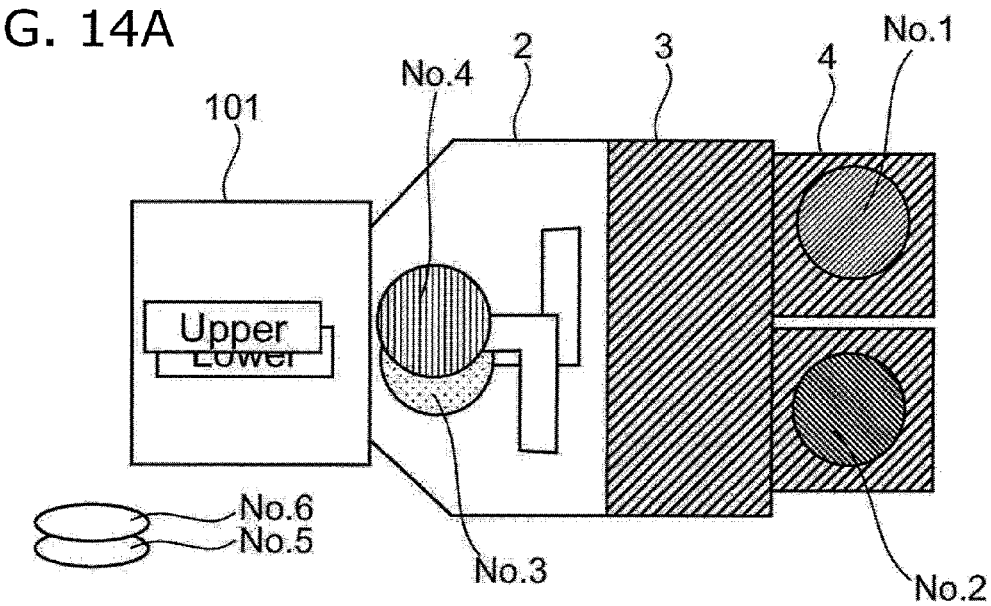
FIG. 14 A-B is a schematic process diagram for describing the comparative example investigated by the inventors.
Figure 14B:
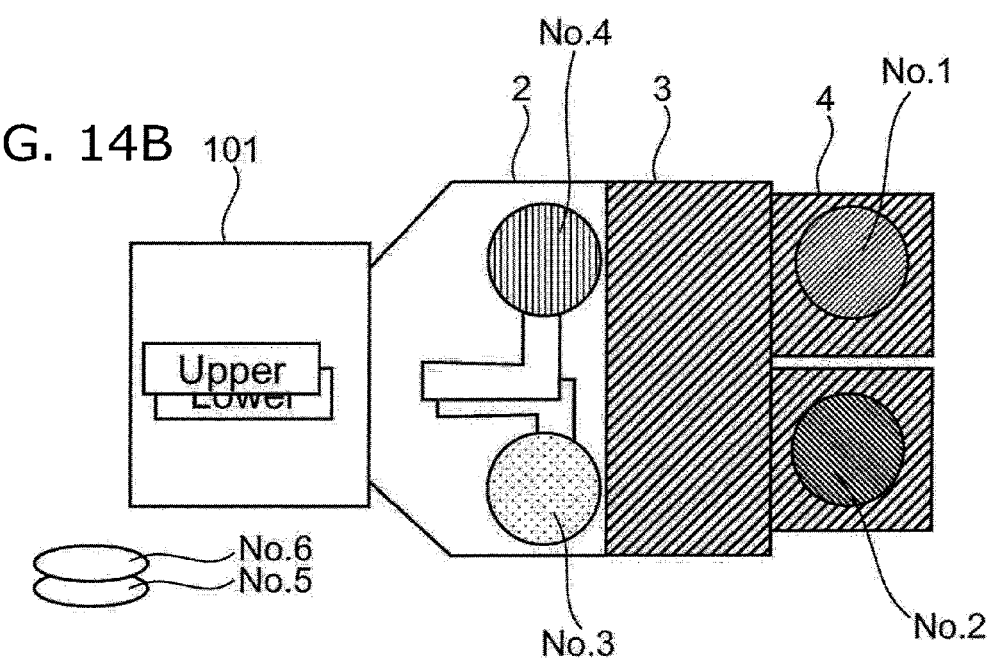

Next, as shown in FIG. 14A, the No. 4 wafer U is handed over to the upper finger of the robot apparatus provided in the load lock chamber, and the No. 3 wafer U is handed over to the lower finger. Subsequently, as shown in FIG. 14B, the upper finger and the lower finger are rotated by 90°, and these wafers U are transferred to the first handling position 8a and the second handling position 8b.

Figure 15A:
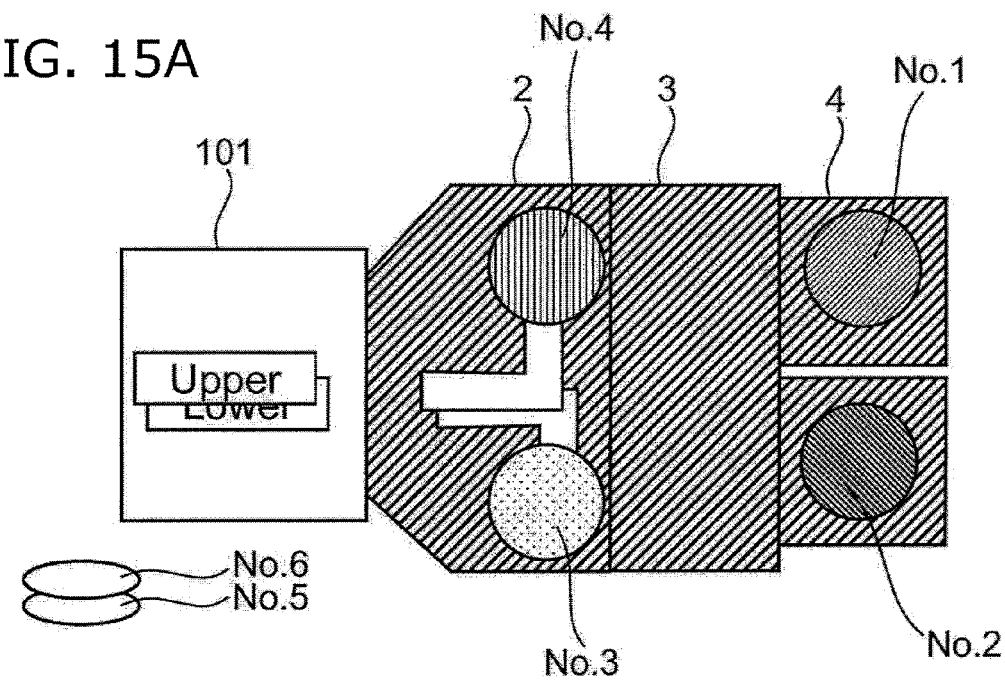
FIG. 15 A-B is a schematic process diagram for describing the comparative example investigated by the inventors.
Figure 15B:
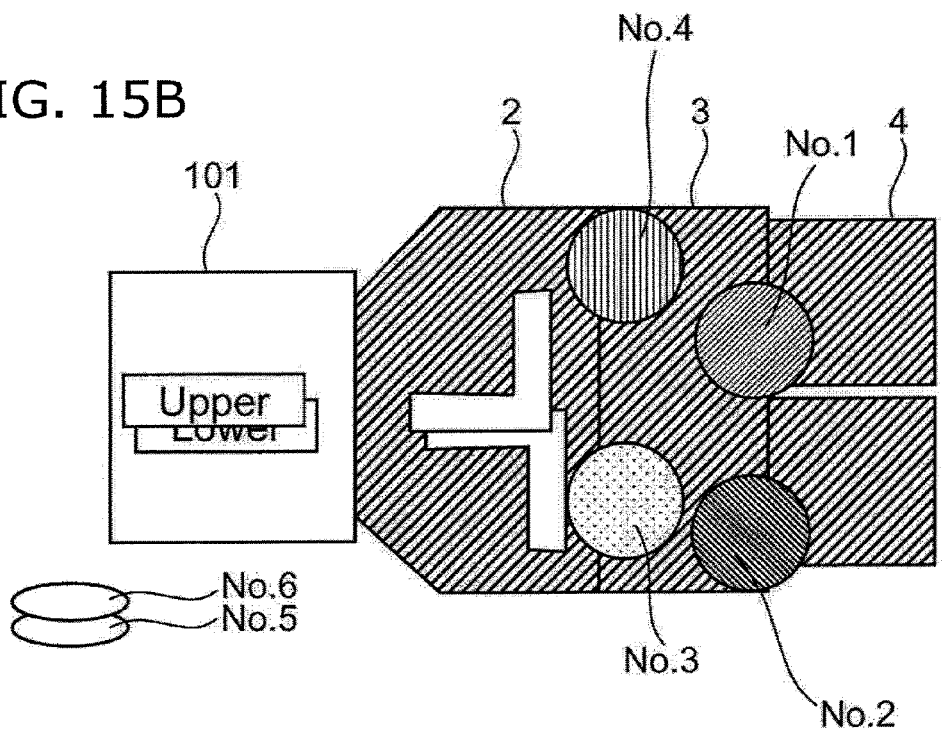

Next, as shown in FIG. 15A, the pressure in the load lock chamber 2 is reduced to a prescribed value. Subsequently, as shown in FIG. 15B, the No. 3 and No. 4 wafer U are handed over to one finger of the robot apparatuses provided in the transfer chamber. In parallel thereto, the No. 1 and No. 2 wafer U, which have finished ashing, are carried out of the processing chambers 4.

Figure 16A:
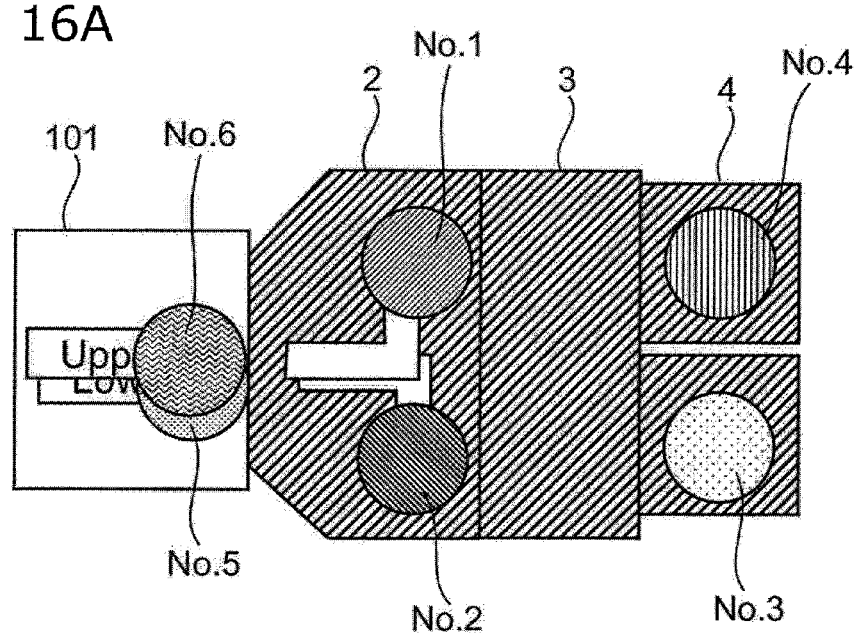
FIG. 16 A-B is a schematic process diagram for describing the comparative example investigated by the inventors.
Figure 16B:
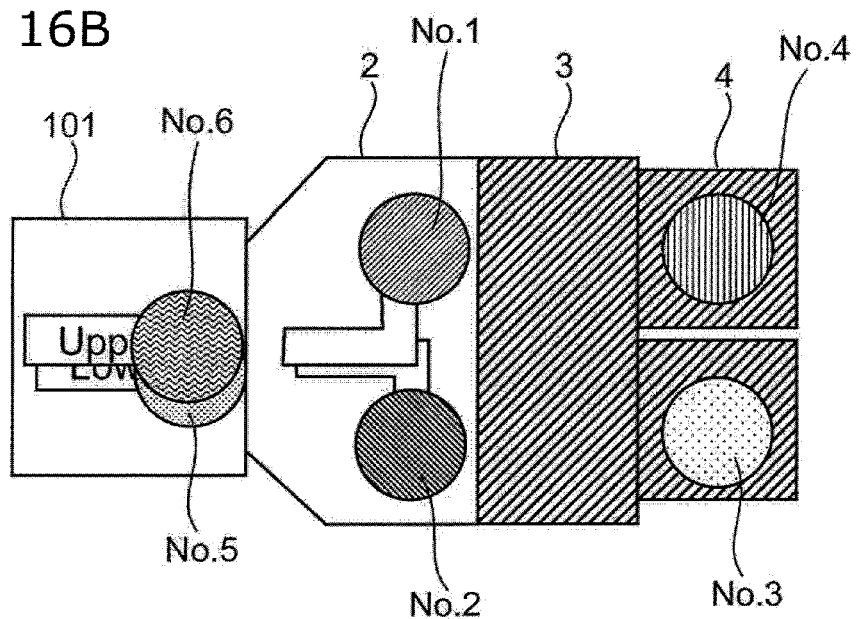

Next, as shown in FIG. 16A, the No. 3 and No. 4 wafer U are carried into the processing chambers 4, placed on the stage, and subjected to ashing. Simultaneously, the No. 1 wafer U is handed over to the upper finger of the robot apparatus provided in the load lock chamber, and the No. 2 wafer U is handed over to the lower finger. In parallel thereto, in the aforementioned sequence, the No. 5 and No. 6 wafer U are extracted from the housing apparatus 103 and transferred to the front of the load lock chamber 2.

Figure 17A:
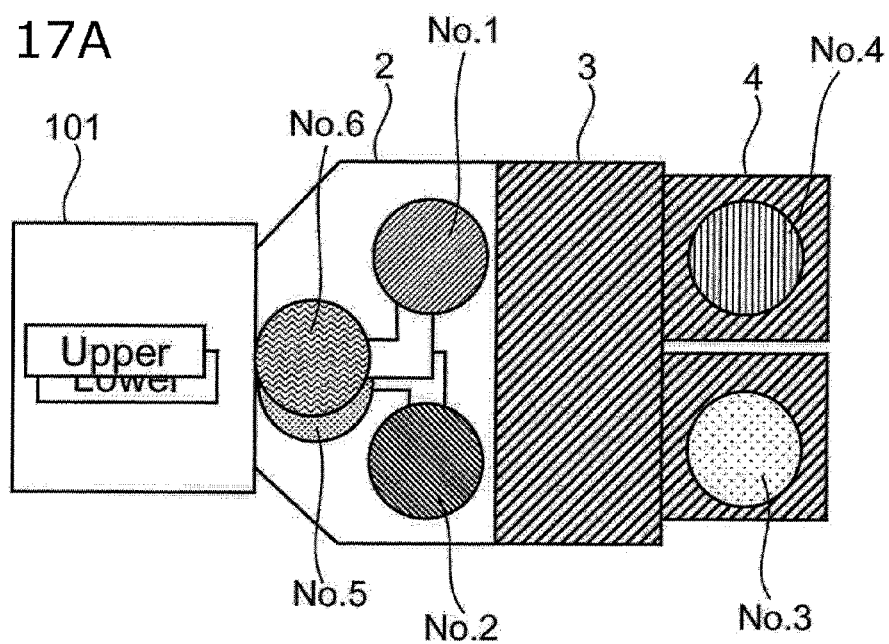
FIG. 17 A-B is a schematic process diagram for describing the comparative example investigated by the inventors.
Figure 17B:
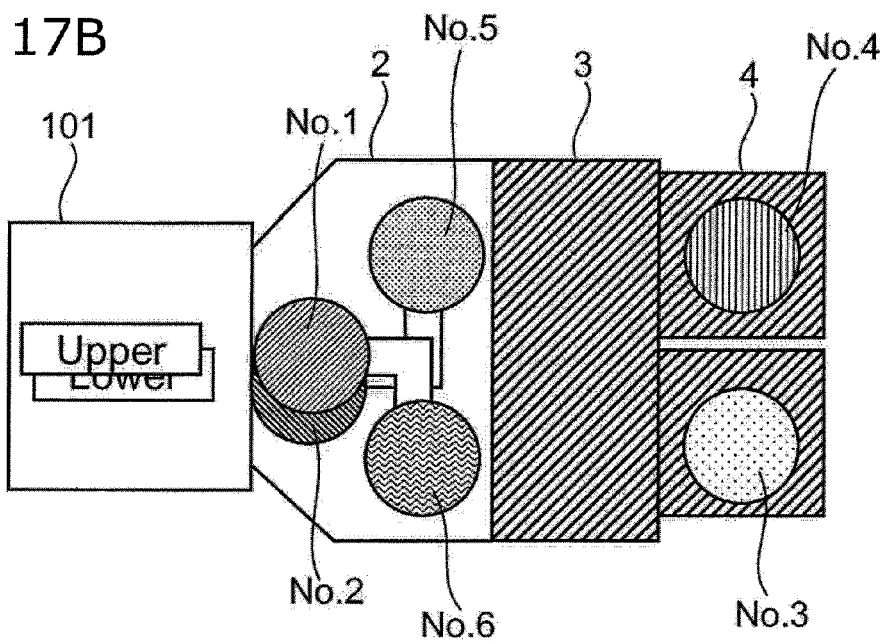

Next, as shown in FIG. 17A, the No. 6 wafer U is handed over to the upper finger of the robot apparatus provided in the load lock chamber, and the No. 5 wafer U is handed over to the lower finger. Subsequently, as shown in FIG. 17B, the upper finger and the lower finger are rotated by 90°, and these wafers U are transferred to the first handling position 8a and the second handling position 8b. In conjunction therewith, the No. 1 and No. 2 wafer U are transferred to the handling position 8c.

At this time, the No. 1 wafer U is placed on the upper finger of the robot apparatus provided in the load lock chamber, and the No. 2 wafer U is placed on the lower finger. This means that the upper-lower relationship is reversed with respect to the relationship before processing described with reference to FIG. 11A (No. 2 wafer U on the upper finger and No. 1 wafer U on the lower finger).

Figure 18:
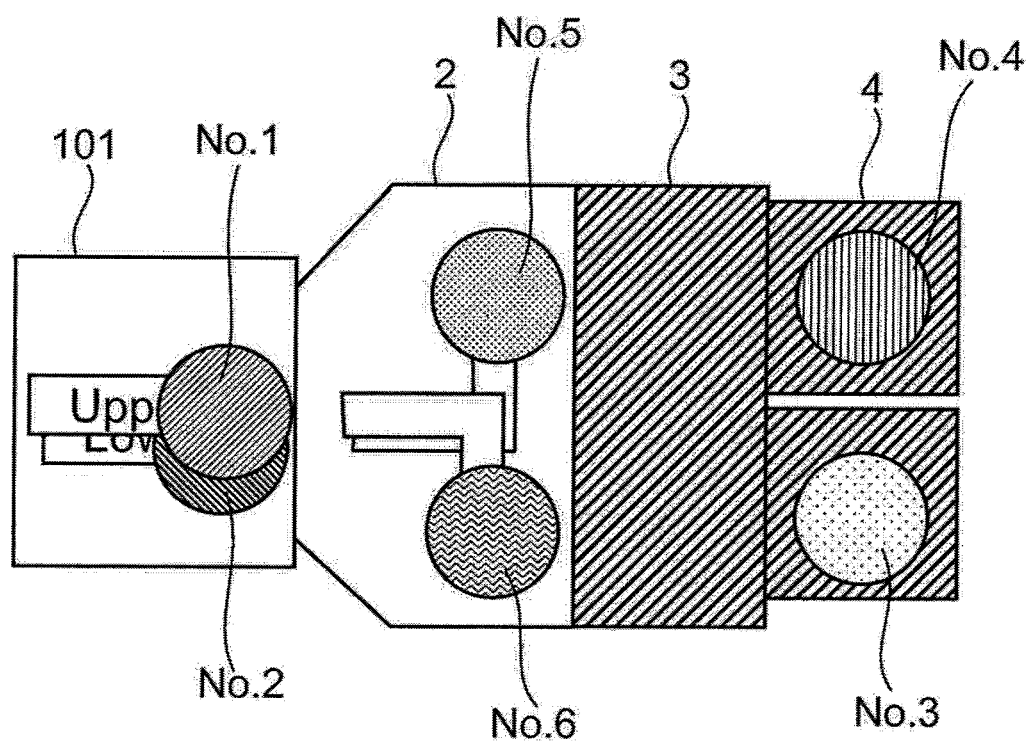
FIG. 18 is a schematic process diagram for describing the comparative example investigated by the inventors.

Then, as shown in FIG. 18, if the No. 1 and No. 2 wafer U are directly handed over to the transfer apparatus 101 and housed in the housing apparatus 103, the wafers U are housed with the upper-lower relationship left reversed.

As a result of investigations, the inventors has found that if the upper finger and the lower finger are rotated by 90° to change the placement position when no wafer U is placed on the upper finger and the lower finger of the robot apparatuses provided in the load lock chamber, the wafers U can be carried out of the load lock chamber with the original upper-lower relationship.

FIG. 19 to 27 are schematic process diagrams for describing the findings obtained by the inventors.

Figure 19A:
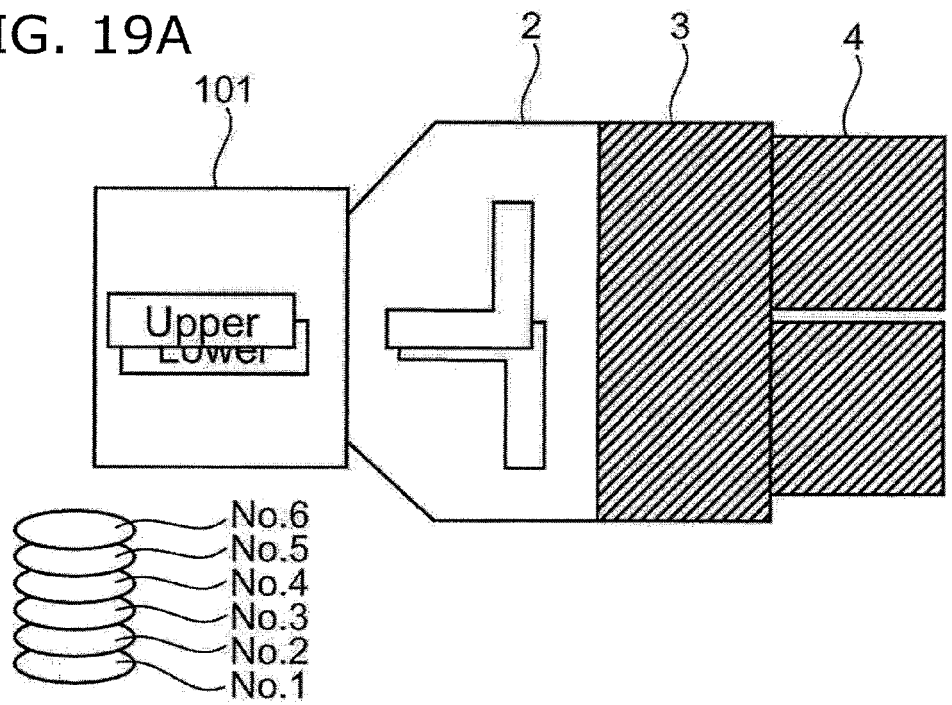
FIG. 19 A-B is a schematic process diagram for describing the findings obtained by the inventors.

As shown in FIG. 19A, six wafers, from No. 1 to No. 6 sequentially from bottom, are housed in the housing apparatus 103. Here, the hatched portion of the ashing system in the figure indicates a reduced-pressure condition.

Figure 19B:
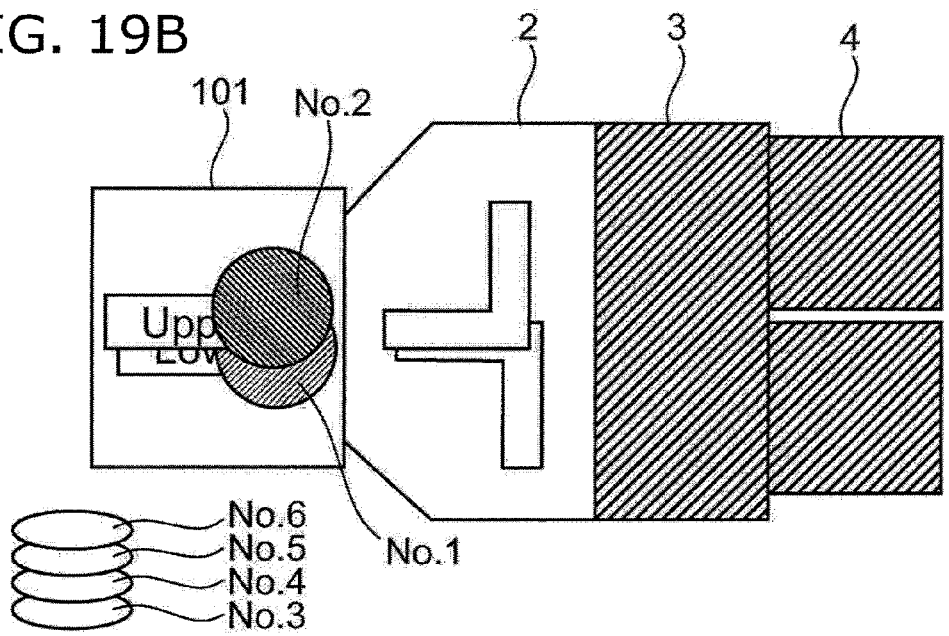

Next, as shown in FIG. 19B, the No. 1 and No. 2 wafer U housed in the housing apparatus 103 are extracted by the transfer apparatus 101 and transferred to the front of the load lock chamber 2.

Figure 20A:
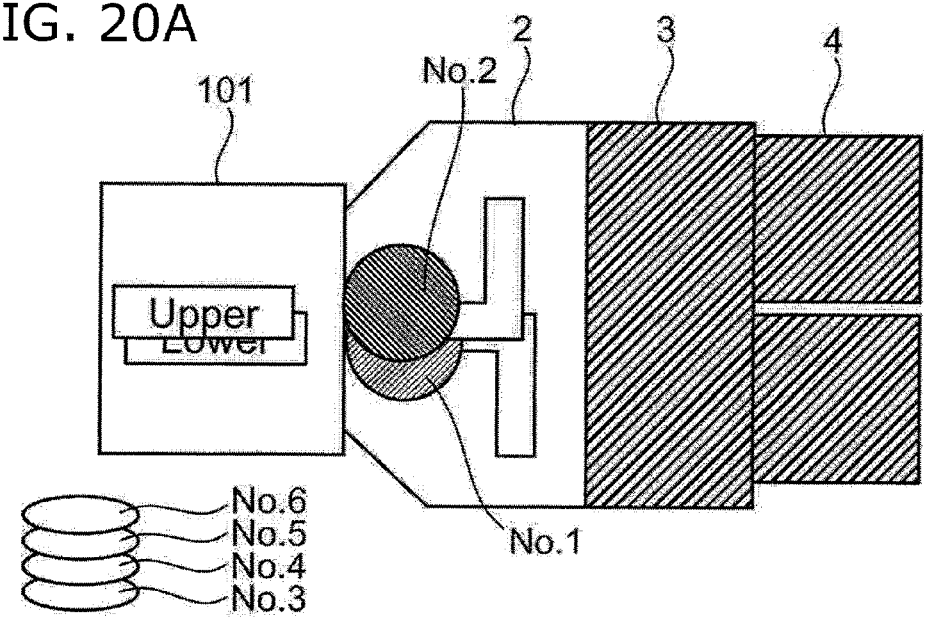
FIG. 20 A-B is a schematic process diagram for describing the findings obtained by the inventors.
Figure 20B:
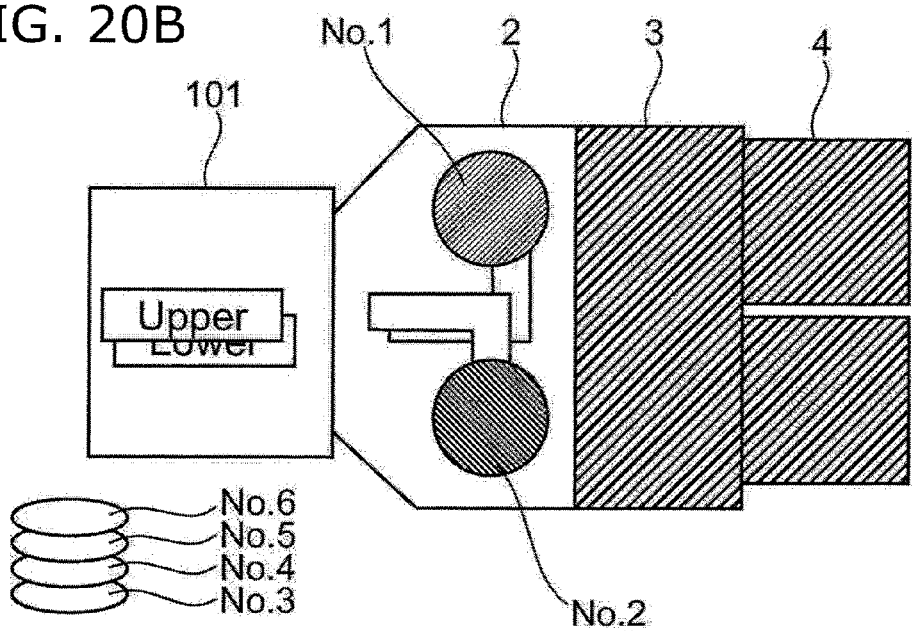

Next, as shown in FIG. 20A, the No. 2 wafer U is handed over to the upper finger of the robot apparatus provided in the load lock chamber, and the No. 1 wafer U is handed over to the lower finger. Subsequently, as shown in FIG. 20B, the upper finger and the lower finger are rotated by 90°, and these wafers U are transferred to the first handling position 8a and the second handling position 8b.

Figure 21A:
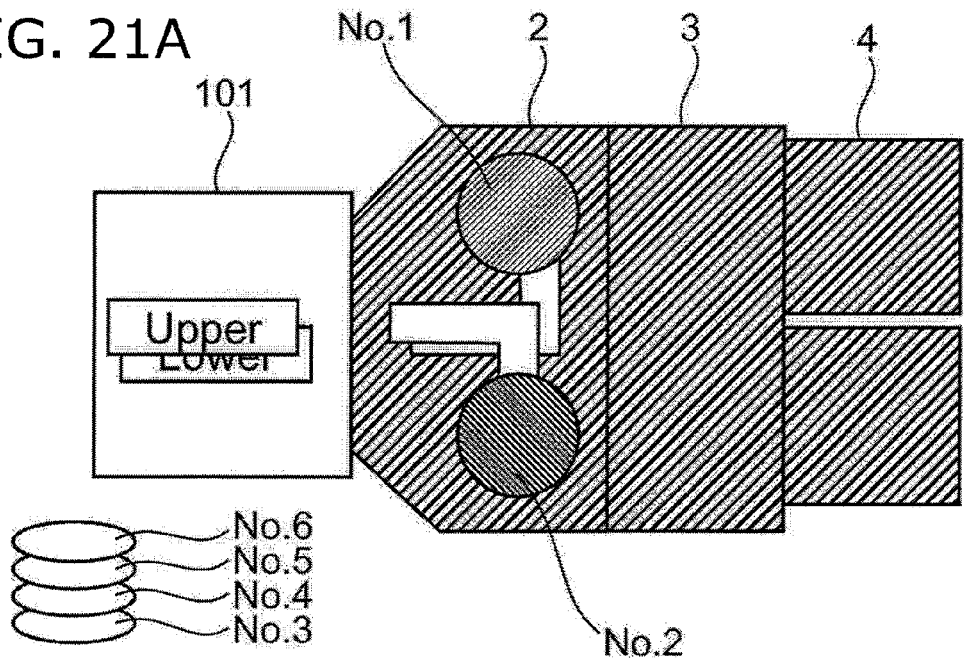
FIG. 21 A-B is a schematic process diagram for describing the findings obtained by the inventors.
Figure 21B:
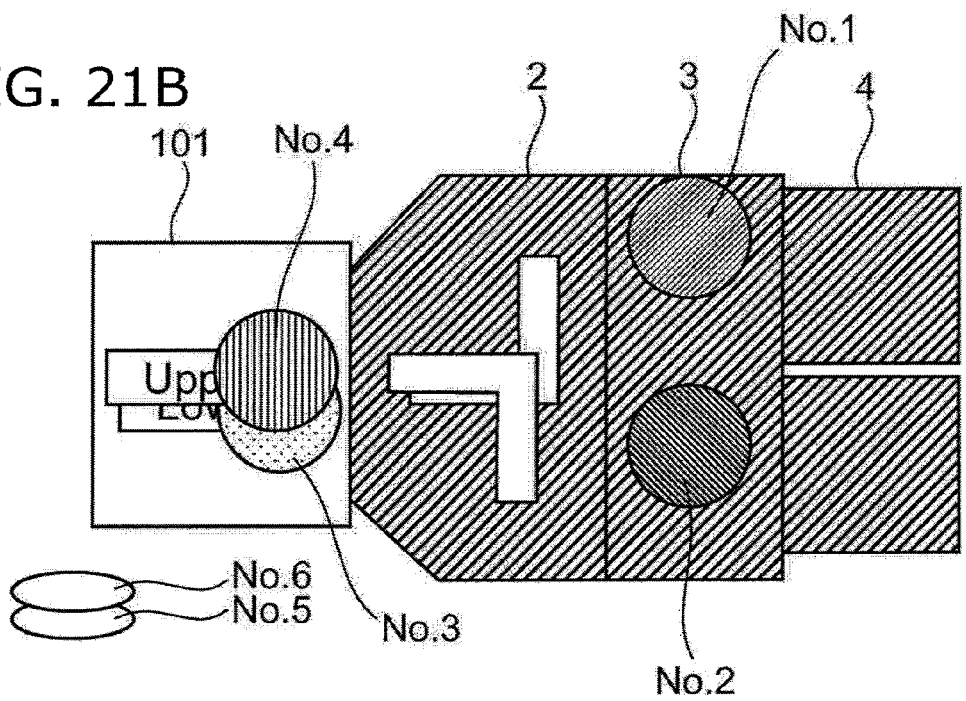

Next, as shown in FIG. 21A, the pressure in the load lock chamber 2 is reduced to a prescribed value. Subsequently, as shown in FIG. 21B, the No. 1 and No. 2 wafer U are handed over to the finger of the robot apparatuses provided in the transfer chamber. In parallel thereto, in the aforementioned sequence, the No. 3 and No. 4 wafer U are extracted from the housing apparatus 103 and transferred to the front of the load lock chamber 2.

Figure 22A:
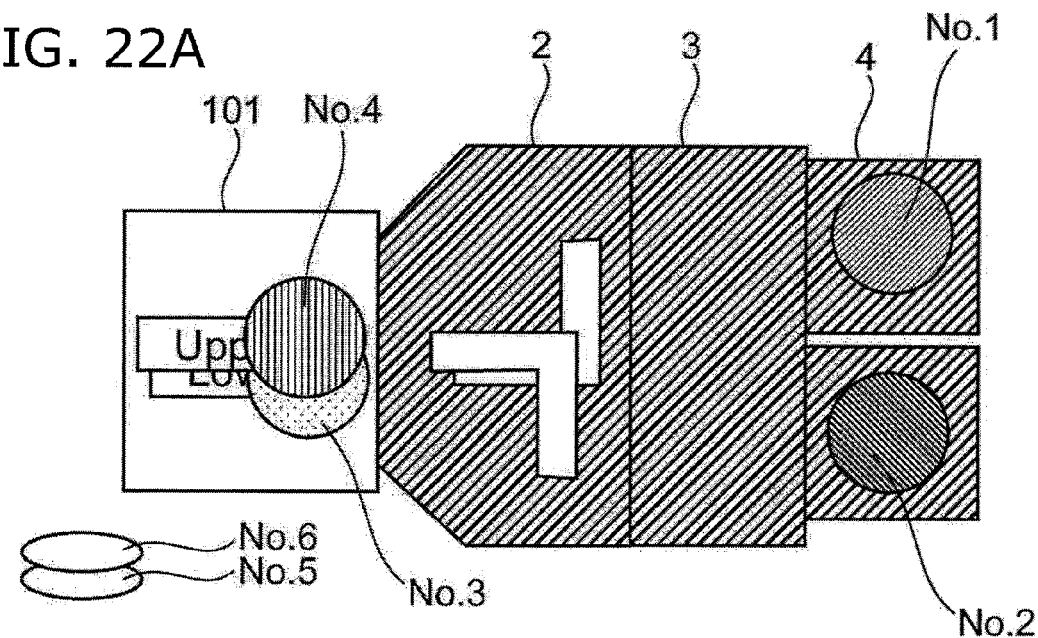
FIG. 22 A-B is a schematic process diagram for describing the findings obtained by the inventors.
Figure 22B:
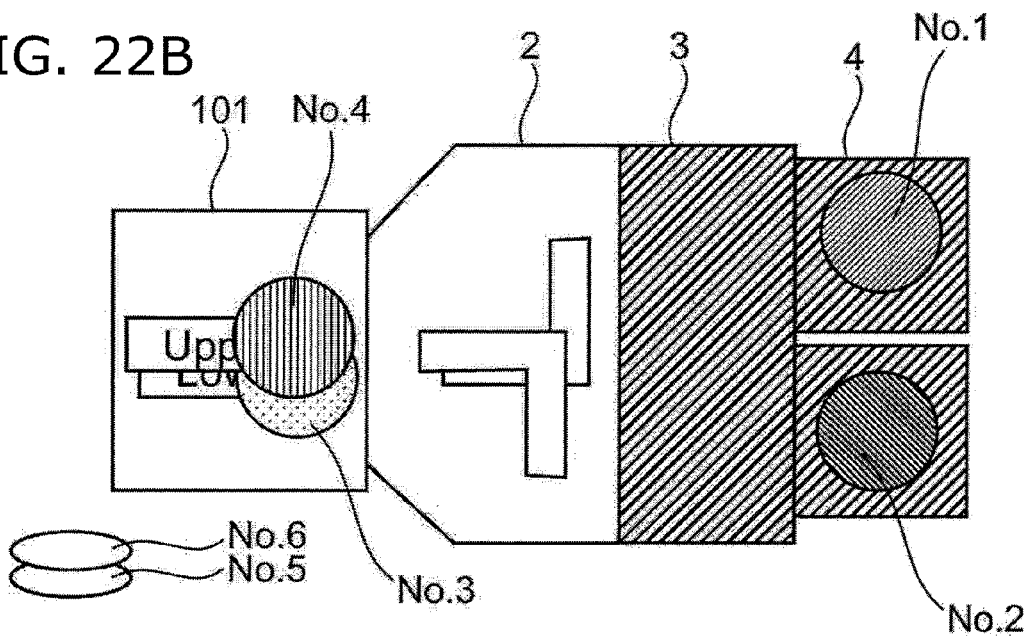

Next, as shown in FIG. 22A, the No. 1 and No. 2 wafer U are carried into the processing chambers 4, placed on the stage, and subjected to ashing. Then, as shown in FIG. 22B, the load lock chamber 2 is returned to the atmospheric pressure.

Figure 23A:
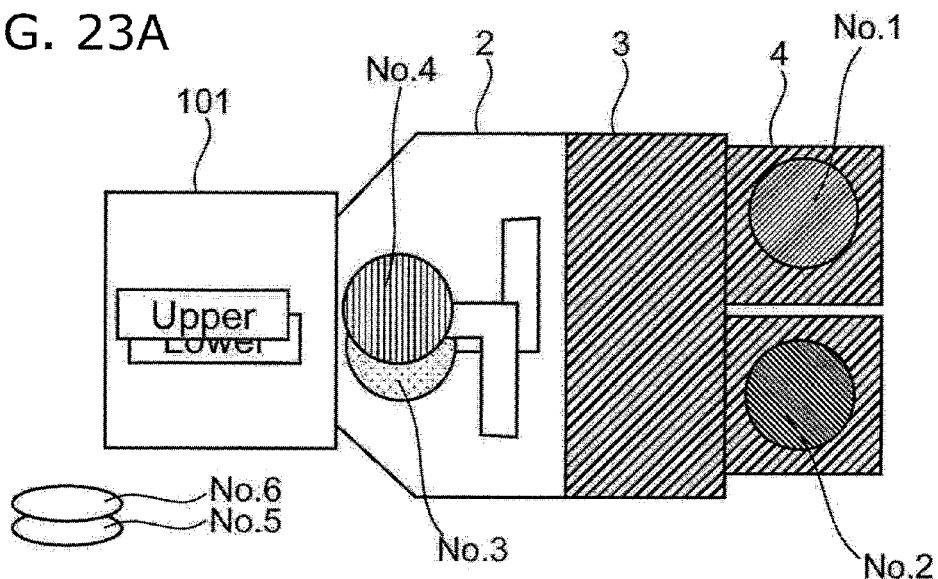
FIG. 23 A-B is a schematic process diagram for describing the findings obtained by the inventors.
Figure 23B:
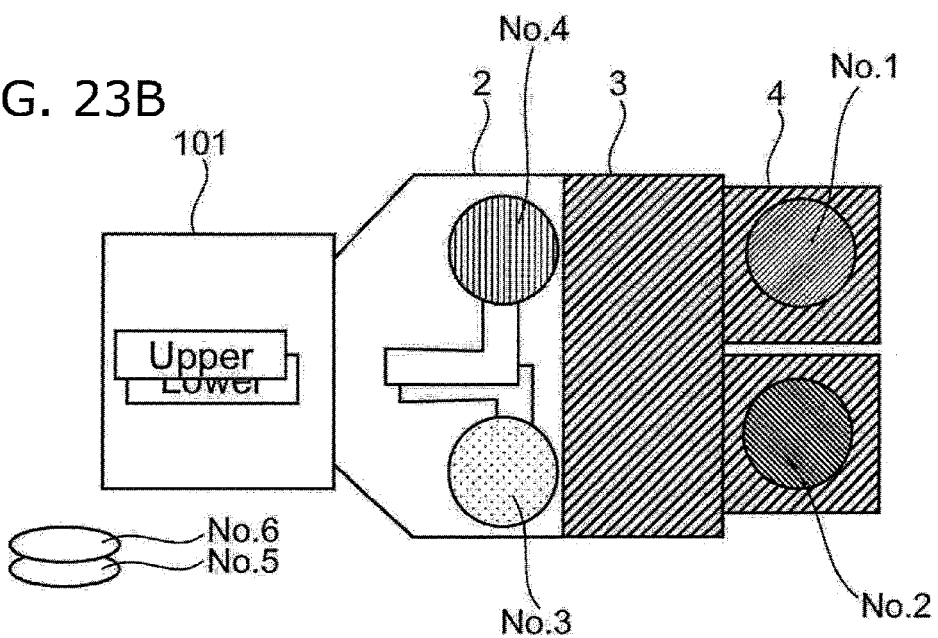

Next, as shown in FIG. 23A, the No. 4 wafer U is handed over to the upper finger of the robot apparatus provided in the load lock chamber, and the No. 3 wafer U is handed over to the lower finger. Subsequently, as shown in FIG. 23B, the upper finger and the lower finger are rotated by 90°, and these wafers U are transferred to the first handling position 8a and the second handling position 8b.

Figure 24A:
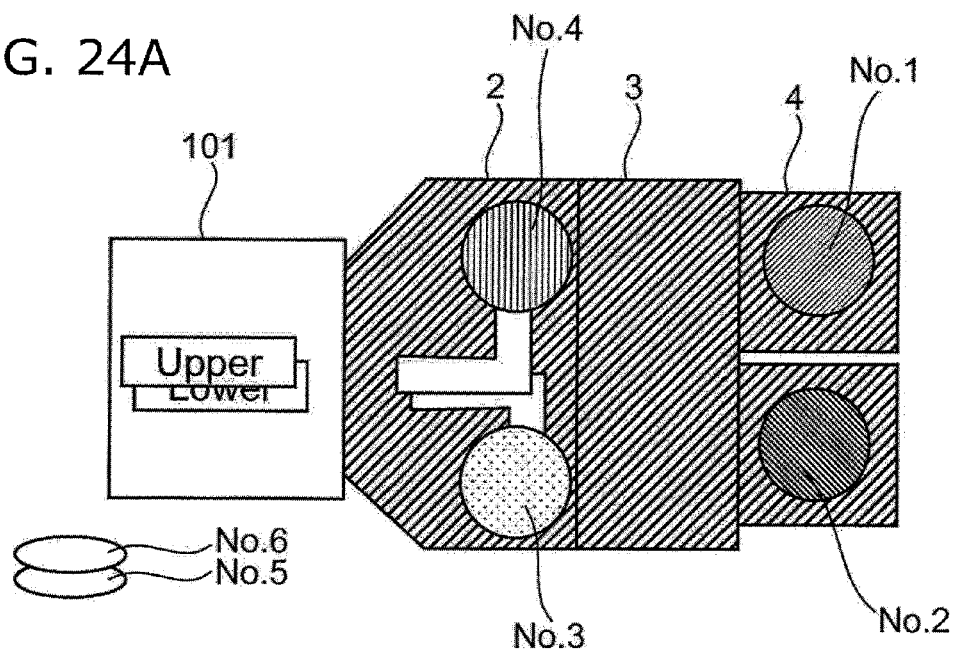
FIG. 24 A-B is a schematic process diagram for describing the findings obtained by the inventors.
Figure 24B:
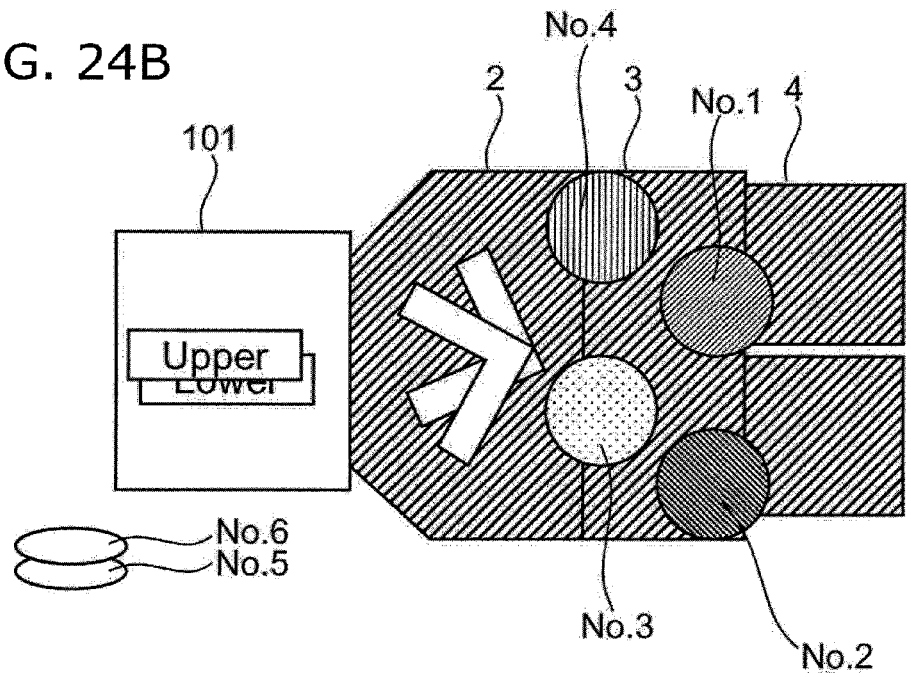

Next, as shown in FIG. 24A, the pressure in the load lock chamber 2 is reduced to a prescribed value. Subsequently, as shown in FIG. 24B, the No. 3 and No. 4 wafer U are handed over to one finger of the robot apparatuses provided in the transfer chamber. In parallel thereto, the No. 1 and No. 2 wafer U, which have finished ashing, are carried out of the processing chambers 4.

At this time, no wafer U is placed on the upper finger and the lower finger of the robot apparatus provided in the load lock chamber. Thus, at this time, the upper finger and the lower finger are rotated by 90°. Here, FIG. 24B shows the position of the upper finger and the lower finger in the process of the rotation.

In this case, if the finger has a shape avoiding interference with the pusher pins 9a, 9b as described with reference to FIG. 7 to 9, the upper finger and the lower finger can be rotated by 90° even while the pusher pings 9a, 9b are moved up, and the productivity can be improved.

Figure 25A:
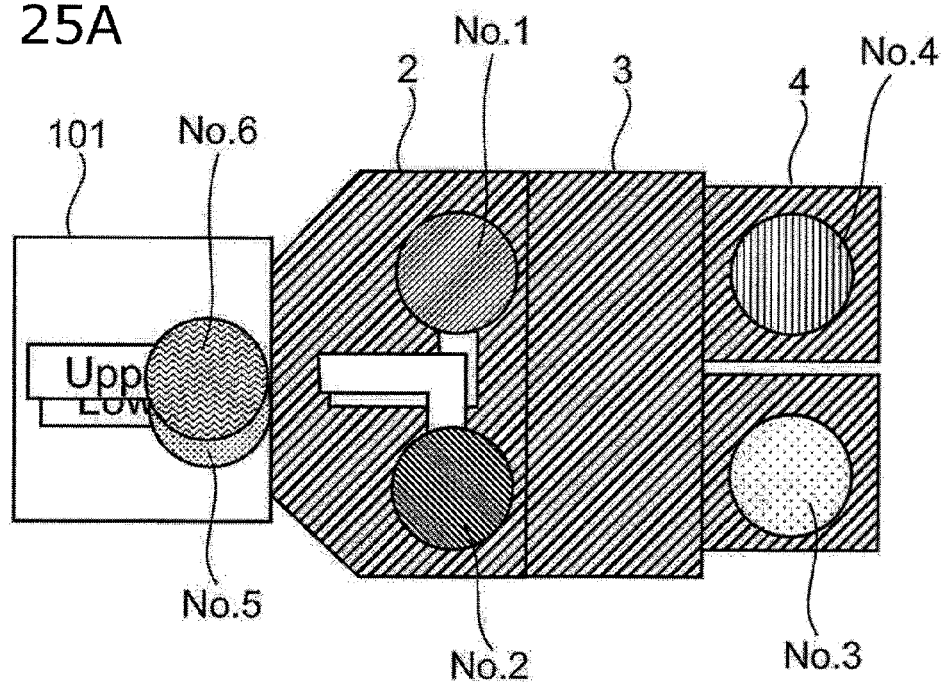
FIG. 25 A-B is a schematic process diagram for describing the findings obtained by the inventors.
Figure 25B:
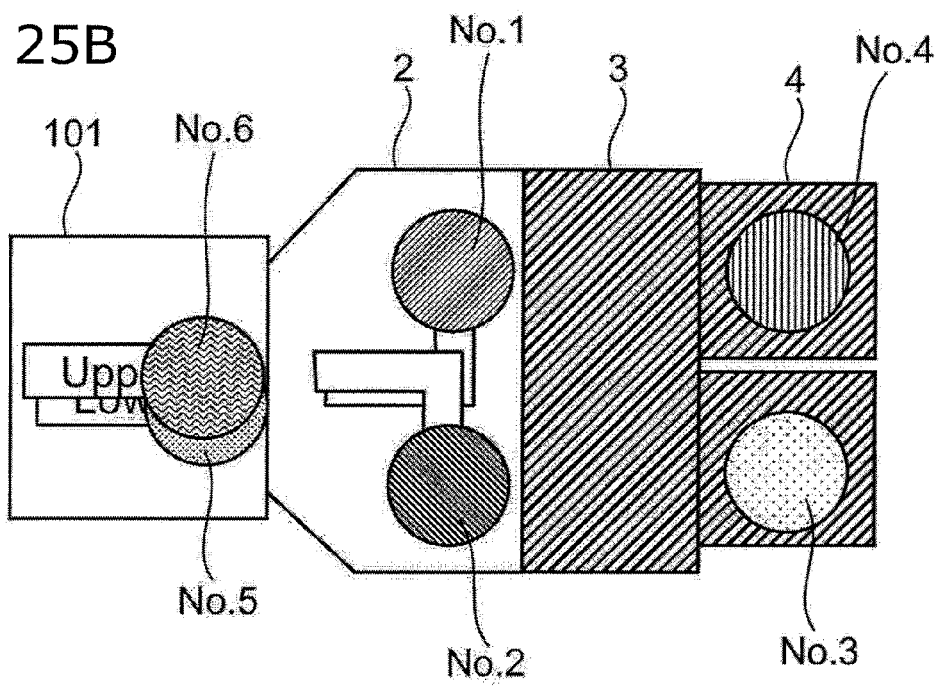

Next, as shown in FIG. 25A, the No. 3 and No. 4 wafer U are carried into the processing chambers 4, placed on the stage, and subjected to ashing. Simultaneously, the No. 1 wafer U is handed over to the lower finger of the robot apparatus provided in the load lock chamber, and the No. 2 wafer U is handed over to the upper finger. In parallel thereto, in the aforementioned sequence, the No. 5 and No. 6 wafer U are extracted from the housing apparatus 103 and transferred to the front of the load lock chamber 2.

Figure 26A:
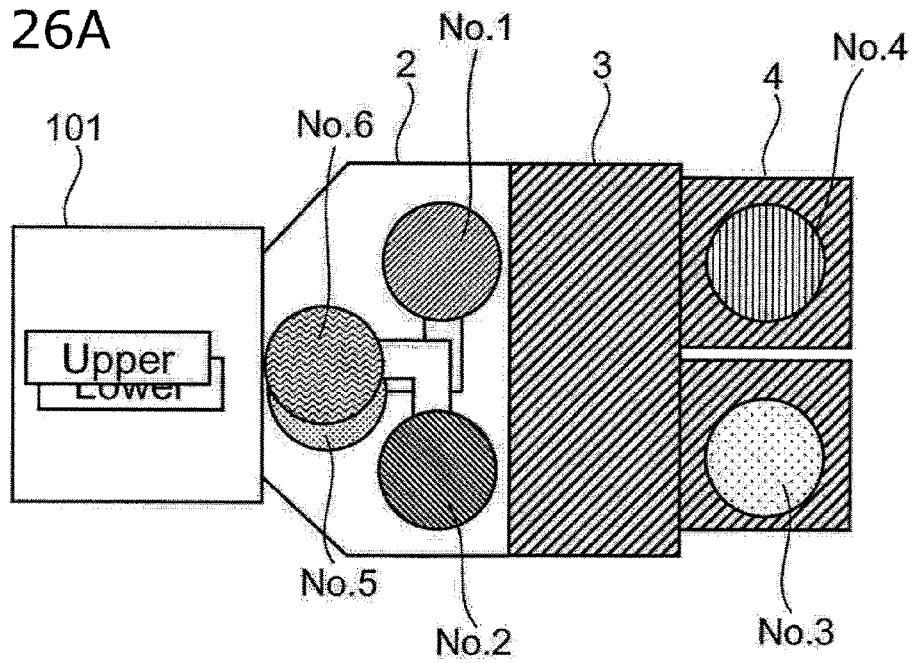
FIG. 26 A-B is a schematic process diagram for describing the findings obtained by the inventors.
Figure 26B:
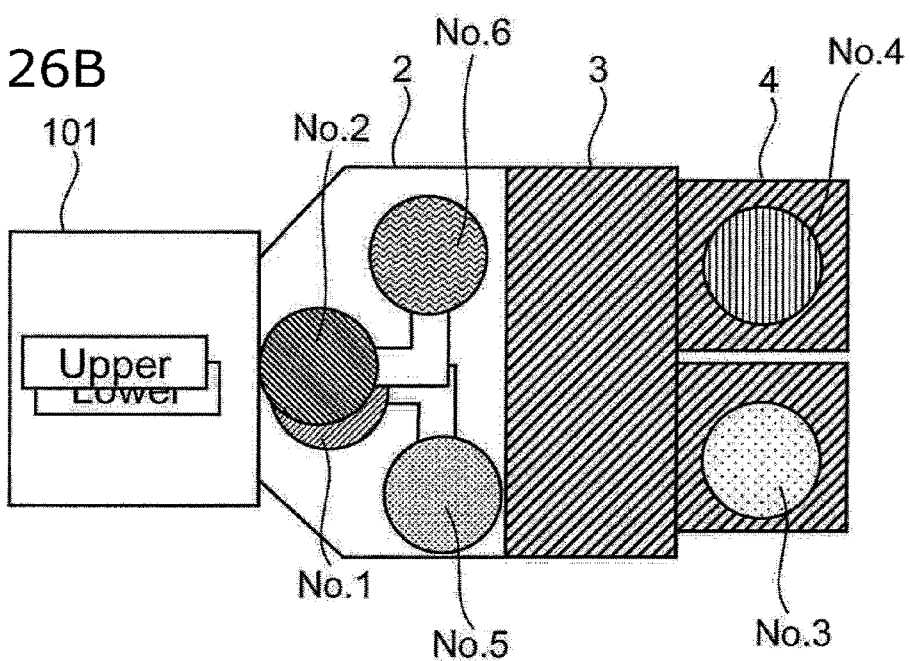

Next, as shown in FIG. 26A, the No. 6 wafer U is handed over to the upper finger of the robot apparatus provided in the load lock chamber, and the No. 5 wafer U is handed over to the lower finger. Subsequently, as shown in FIG. 26B, the upper finger and the lower finger are rotated by 90°, and these wafers U are transferred to the first handling position 8a and the second handling position 8b. In conjunction therewith, the No. 1 and No. 2 wafer U are transferred to the handling position 8c.

Subsequently, this sequence is repeated to continue ashing wafers U.

At this time, according to this embodiment, the No. 2 wafer U is placed on the upper finger of the robot apparatus provided in the load lock chamber, and the No. 1 wafer U is placed on the lower finger. This means that the upper-lower relationship is the same as the relationship before processing described with reference to FIG. 20A (No. 2 wafer U on the upper finger and No. 1 wafer U on the lower finger).

Figure 27:
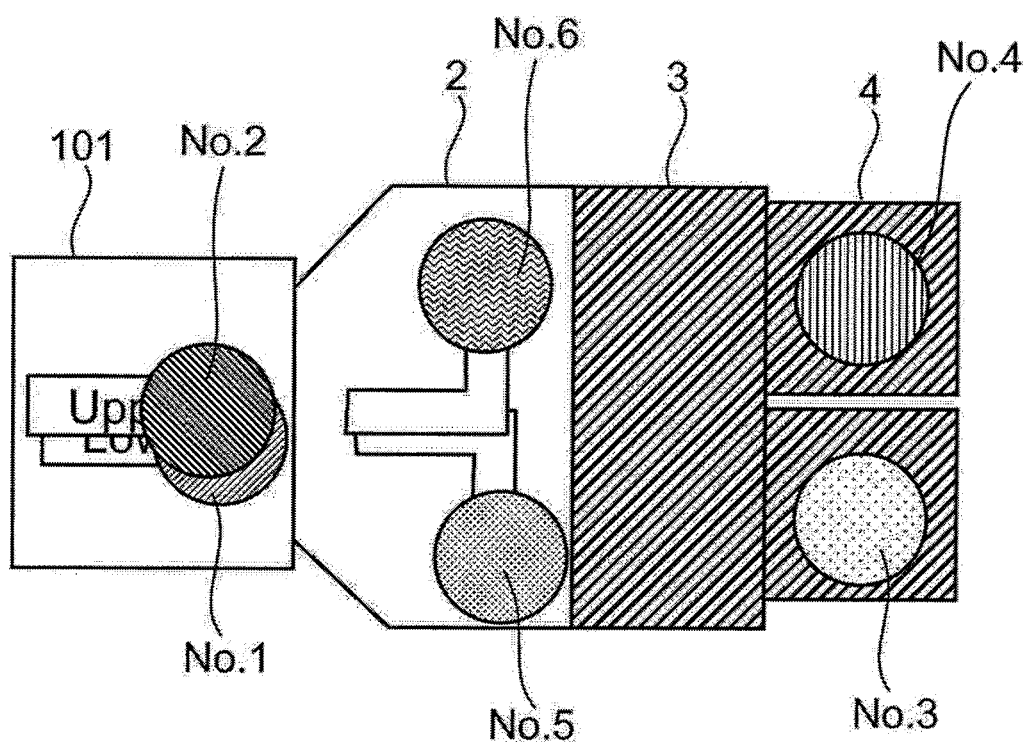
FIG. 27 is a schematic process diagram for describing the findings obtained by the inventors.

Then, as shown in FIG. 27, if the No. 1 and No. 2 wafer U are directly handed over to the transfer apparatus 101 and housed in the housing apparatus 103, the wafers U can be housed with the original upper-lower relationship.

In this embodiment, the operation of rotating the upper finger and the lower finger by 90° described with reference to FIG. 24B only needs to be performed once every two occasions. Here, the occasion refers to the occasion at which the robot apparatus provided in the load lock chamber 2 exchanges wafers U before ashing for ashed wafers U.

Depending on the configuration of the finger of the robot apparatus provided in the load lock chamber, such operation can be performed every occasion, or can be performed once every prescribed number of occasions as described above.

Furthermore, a means for memorizing the transfer state of the wafers U can be provided to store the transfer record of each wafer U so that the fingers can be operated in response to determination as to which arm portion of the finger a particular wafer U should be returned to. For example, the arm portion used for transferring an unprocessed wafer may be memorized so that the finger can be switched to hand over the processed wafer U to the same arm portion.

For convenience of description, the processing apparatus 1 according to the embodiment of the invention is assumed to be a wafer ashing apparatus. However, the invention is not limited thereto. For example, the invention is also applicable to a reduced-pressure processing apparatus such as an etching apparatus and film formation apparatus, an apparatus for processing under the atmospheric pressure, and a so-called wet processing apparatus such as a cleaning apparatus and wet etching apparatus, for a glass substrate for liquid crystal display devices, a wafer for semiconductor devices and the like.

However, in consideration of, for example, returning a workpiece to the original housing position and providing a slow cooling means to prevent the processed workpiece at high temperature from cracking, the invention is preferably applied to ashing a wafer for semiconductor devices.

The embodiment of the invention has been described with reference to examples. However, the invention is not limited to these examples.

Those skilled in the art can suitably modify the above examples, and such modifications are also encompassed within the scope of the invention as long as they fall within the spirit of the invention.

For example, the shape, dimension, material, layout and the like of the components of the processing apparatus 1 and the ashing system 100 are not limited to those illustrated, but can be suitably modified.

Figure 28:
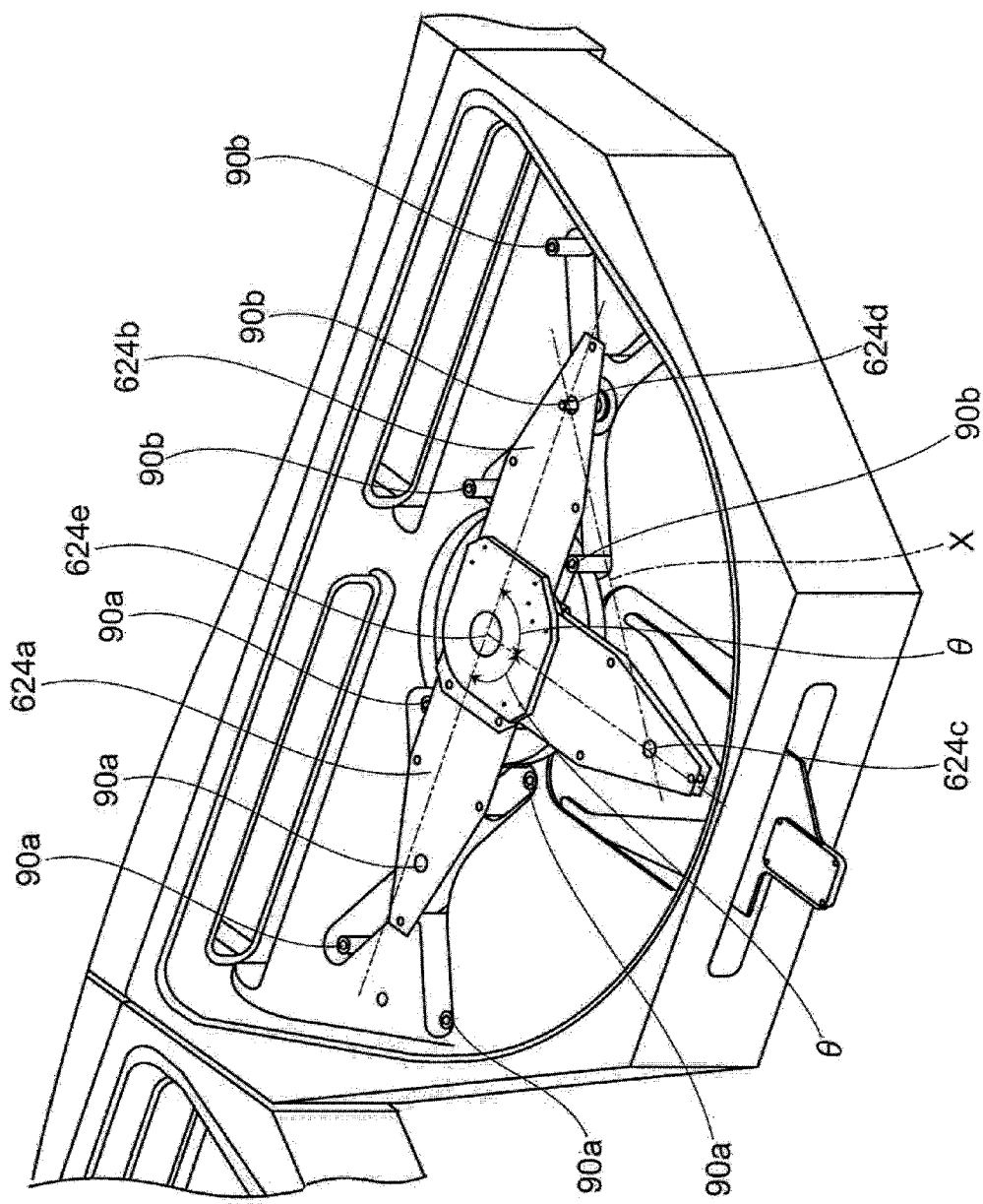
FIG. 28 is a schematic perspective view for illustrating another example of the finger of the robot apparatus provided in the load lock chamber.

Furthermore, in the above description, three pusher pins movable vertically are provided at the handling position 8a, 8b. However, for example, in consideration of the deformation of a large workpiece, as shown in FIG. 28, five pusher pins 90a, 90b movable vertically can be provided. The number and layout of pusher pins are not limited to those illustrated, but can be suitably modified.

Furthermore, as shown in FIG. 28, the finger 624a, 624b can be shaped so that its cross-sectional dimension of the extending end gradually decreases toward the tip.

Furthermore, as shown in FIG. 28 (and also in FIG. 1), in the above description, the angle θ between the arm portions of the finger 624a, 624b is generally a right angle, but the invention is not limited thereto. More specifically, it is necessary to allow a plurality of workpieces W received at one location to be distributed by the rotation of the finger. For example, with reference to the finger 624b side, this can be achieved if the rotation center 624e of the finger is not located on the line X connecting between the centers 624c and 624d of the finger tip portion where a workpiece is to be placed.

Furthermore, the number of fingers of the robot apparatus provided in the load lock chamber can be varied, or fingers with different shapes can be combined. For example, two fingers having a generally L shape and one linear finger can be combined. This combination can be used in conjunction with three robot apparatuses in the transfer chamber 3 and providing three processing chambers 4.

Furthermore, the components of the above examples can be combined as long as feasible, and such combinations are also encompassed within the scope of the invention as long as they fall within the spirit of the invention.

Industrial Applicability

This invention can provide a robot apparatus and a processing apparatus provided therewith, an ashing system, and an ashing method, which can further improve productivity without incurring size increase and high cost.

The invention claimed is:

1. A robot apparatus configured to hand over a workpiece by rotating by a prescribed angle a finger including a holding means for holding the workpiece, the robot apparatus comprising:
   a drive shaft including a first finger and a second finger spaced from each other,
   the first finger including a first arm portion and a second arm portion extending from its rotation center with a prescribed angle therebetween so as to be distanced from each other, and
   the second finger including a third arm portion and a fourth arm portion extending from its rotation center with a prescribed angle therebetween so as to be distanced from each other,
   wherein the second arm portion is at a first handling position and the fourth arm portion is at a second handling position when the first arm portion and the third arm portion overlap at a third handling position,
   wherein the first arm portion is at the second handling position and the third arm portion is at the first handling position when the second arm portion and the fourth arm portion overlap at the third handling position, and
   wherein the first handling position, the second handling position and the third handling position are positions at which said or another workpiece is handed over and received.

2. A processing apparatus comprising:
   a load lock chamber including a first robot apparatus according to claim 1;
   a processing chamber configured to process a workpiece; and
   a transfer chamber including a second robot apparatus configured to transfer the workpiece received from the first robot apparatus to the processing chamber.

3. A processing system comprising:
   the processing apparatus according to claim 2;
   a housing apparatus configured to house wafers;
   a transfer apparatus configured to simultaneously receive two of the wafers from the housing apparatus and transfer them to the processing apparatus; and
   a slow cooling means for slowly cooling the wafer processed by the processing apparatus.

4. A processing method comprising:
   when the wafer is not placed on the first finger and the second finger of the robot apparatus according to claim 1 provided in a load lock chamber,
   controlling a rotational movement of the first finger and the second finger; and
   handing over the wafer after processing to an arm portion used in transferring the wafer before processing.

* * * * *

UNITED STATES PATENT AND TRADEMARK OFFICE
CERTIFICATE OF CORRECTION

PATENT NO. : 8,434,993 B2
APPLICATION NO. : 12/516819
DATED : May 7, 2013
INVENTOR(S) : Hidehito Azumano et al.

It is certified that error appears in the above-identified patent and that said Letters Patent is hereby corrected as shown below:

In the specification, column 8, line 12, please delete "10c" and add -- 101c --

In the specification, column 10, line 14, please delete "8aand" and add -- 8a and --

Signed and Sealed this
Twenty-fourth Day of September, 2013

Teresa Stanek Rea
*Deputy Director of the United States Patent and Trademark Office*

UNITED STATES PATENT AND TRADEMARK OFFICE
CERTIFICATE OF CORRECTION

PATENT NO. : 8,434,993 B2  Page 1 of 1
APPLICATION NO. : 12/516819
DATED : May 7, 2013
INVENTOR(S) : Azumano et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 921 days.

Signed and Sealed this
Eighth Day of September, 2015

Michelle K. Lee
*Director of the United States Patent and Trademark Office*